United States Patent [19]
Kitano et al.

[11] Patent Number: 5,876,280
[45] Date of Patent: Mar. 2, 1999

[54] SUBSTRATE TREATING SYSTEM AND SUBSTRATE TREATING METHOD

[75] Inventors: Junichi Kitano; Hiroshi Shinya, both of Kofu; Takayuki Katano, Nirasaki; Hidetami Yaegashi, Kokubunji; Yasunori Kawakami, Kikuchi; Fumihiko Kawano, Hachioji, all of Japan

[73] Assignee: Tokyo Electron Limited, Tokyo, Japan

[21] Appl. No.: 864,937

[22] Filed: May 29, 1997

[30] Foreign Application Priority Data

May 30, 1996 [JP] Japan ..................................... 8-137263
Aug. 29, 1996 [JP] Japan ..................................... 8-247261

[51] Int. Cl.⁶ ....................................................... F24F 7/06
[52] U.S. Cl. ......................... 454/187; 55/385.2; 414/217; 414/222; 414/940
[58] Field of Search ........................... 454/187; 55/385.1, 55/385.2, 467, 472, 97; 414/217, 937, 940, 277, 222

[56] References Cited

U.S. PATENT DOCUMENTS 5,096,477  3/1992  Shinoda et al. .................... 454/187 X
5,139,459  8/1992  Takahashi et al. .................... 454/187
5,565,034  10/1996  Nanbu et al. .

FOREIGN PATENT DOCUMENTS 7-130721  5/1995  Japan .

Primary Examiner—Harold Joyce
Attorney, Agent, or Firm—Oblon, Spivak, McClelland, Maier & Neustadt, P.C.

[57] ABSTRACT

The present invention provides a substrate treating system for successively treating a plurality of substrates W under an air-conditioned environment. The system comprises an outer casing provided with a cassette transfer port through which a cassette is transferred, a cassette section having a cassette table arranged within an inner space surrounded by the outer casing for supporting the cassette transferred through the cassette transfer port, a sub-arm mechanism for taking the substrates one by one from the cassette section, a process section positioned adjacent to the cassette section and having a plurality of treating units for treating the substrates arranged therein, a main arm mechanism arranged within the process section for receiving the substrates from the sub-arm mechanism arranged in the cassette section and, then, transferring the received substrates to each of the treating units while transferring the treated substrates out of the treating units, an air supply mechanism for supplying a clean air to form a down-stream within the space surrounded by the outer casing, and a partition plate for partitioning the inner space surrounded by the outer casing not to interfere the down-flow of the air formed by the air supply mechanism, the partition plate having a substrate transfer port through which the substrate is transferred from one of the partitioned spaces to the other partitioned space.

26 Claims, 21 Drawing Sheets

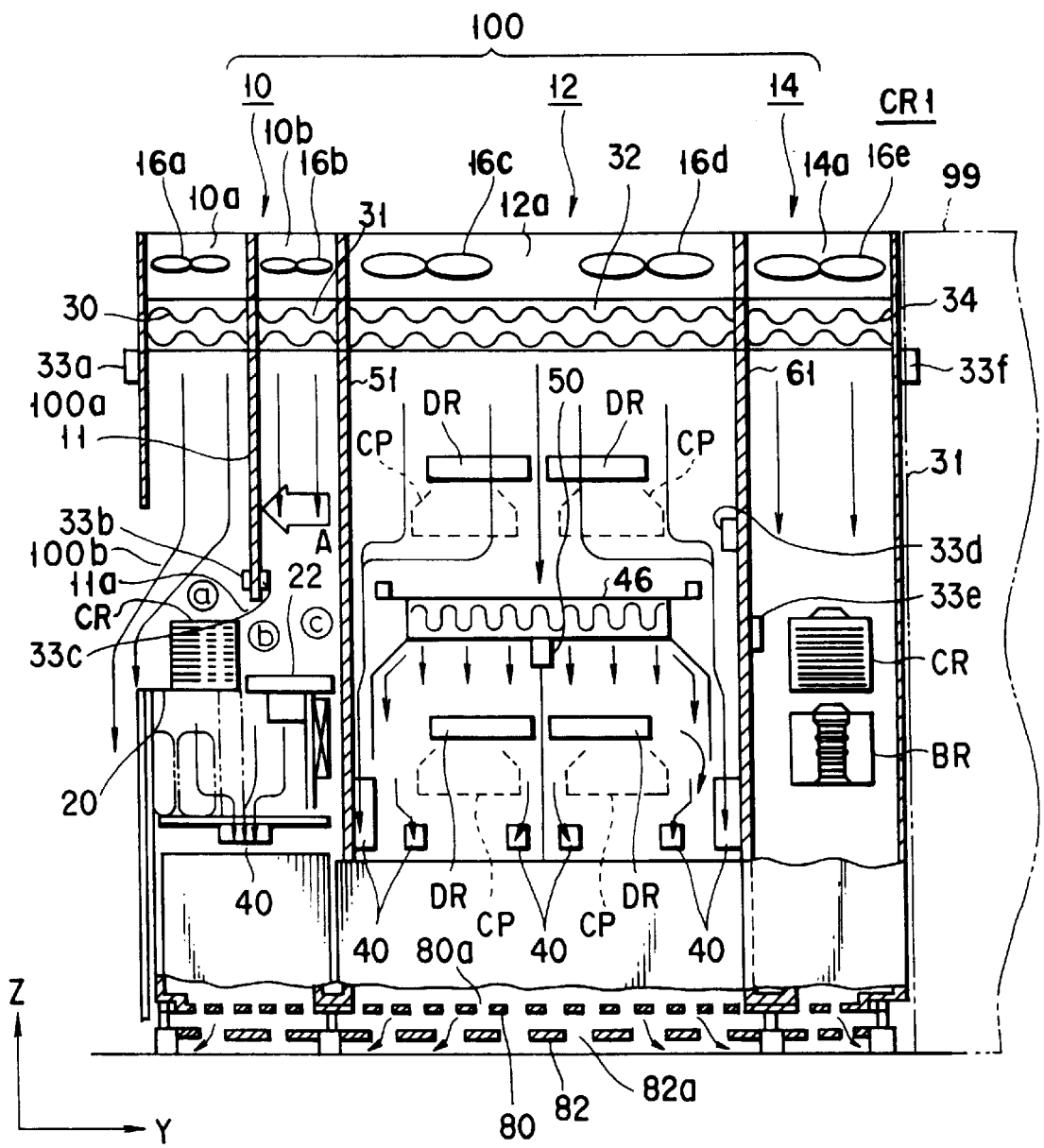
F I G. 6

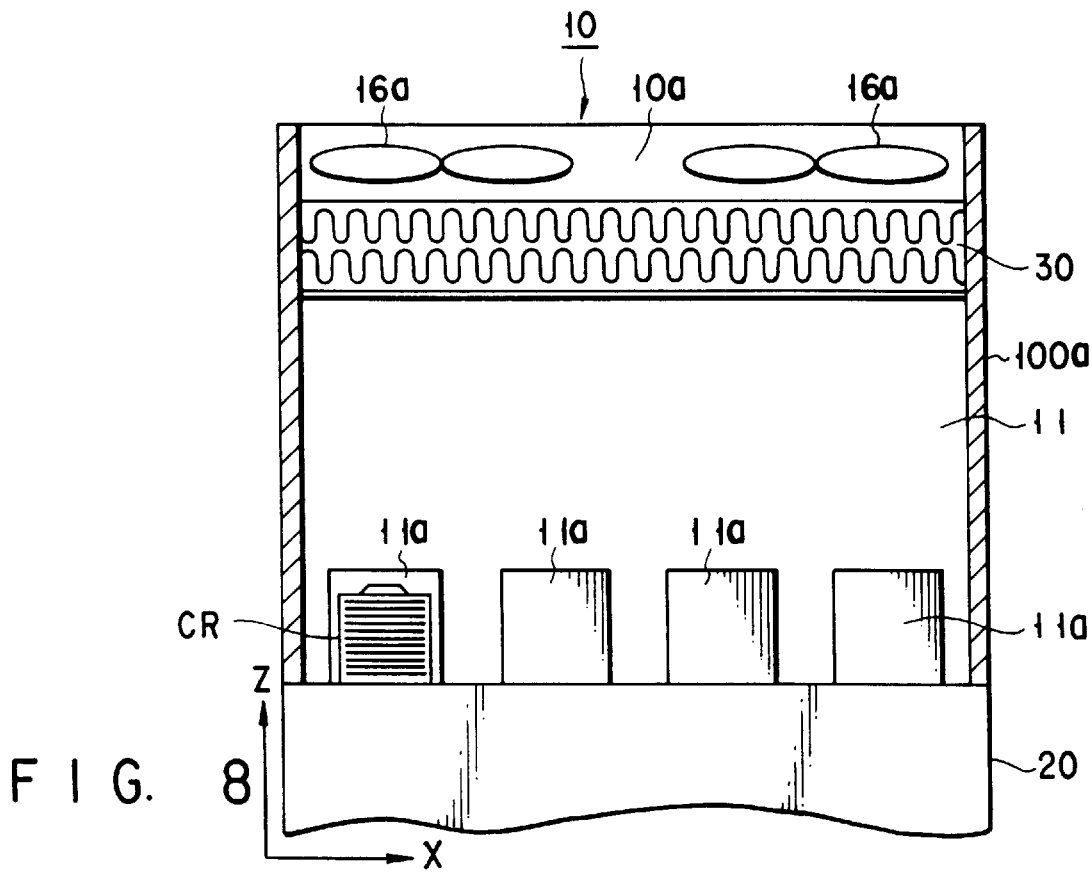
F I G. 8
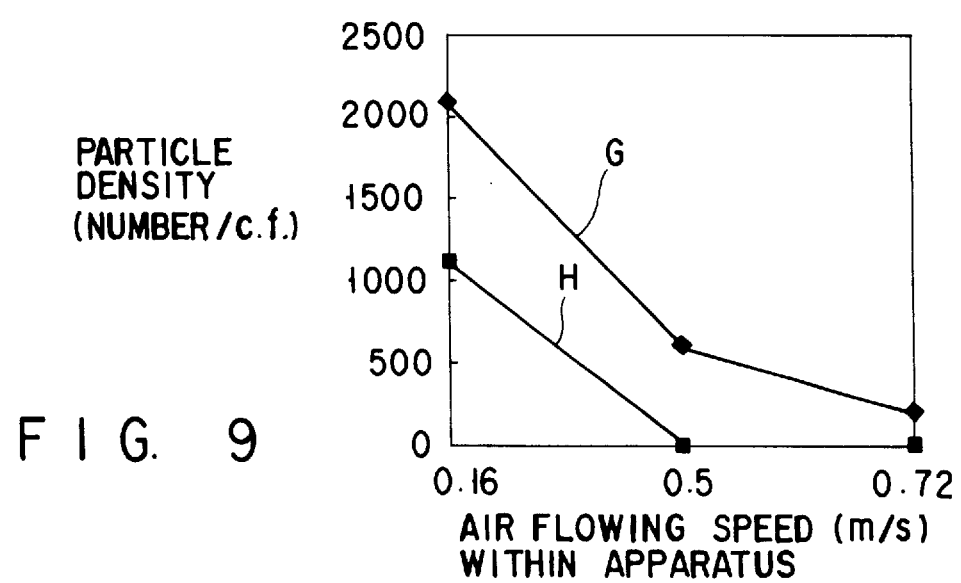
F I G. 9

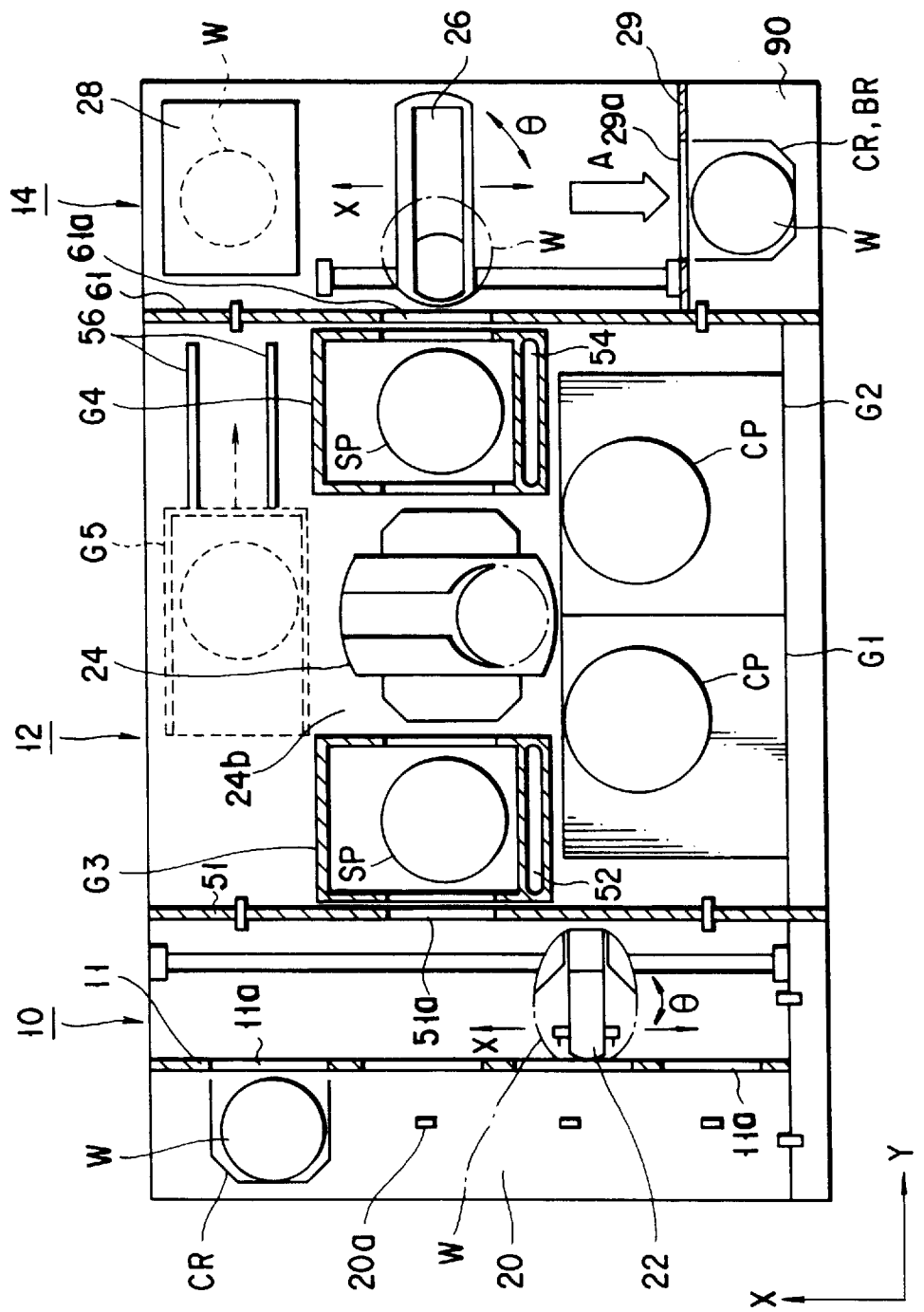
F I G. 11

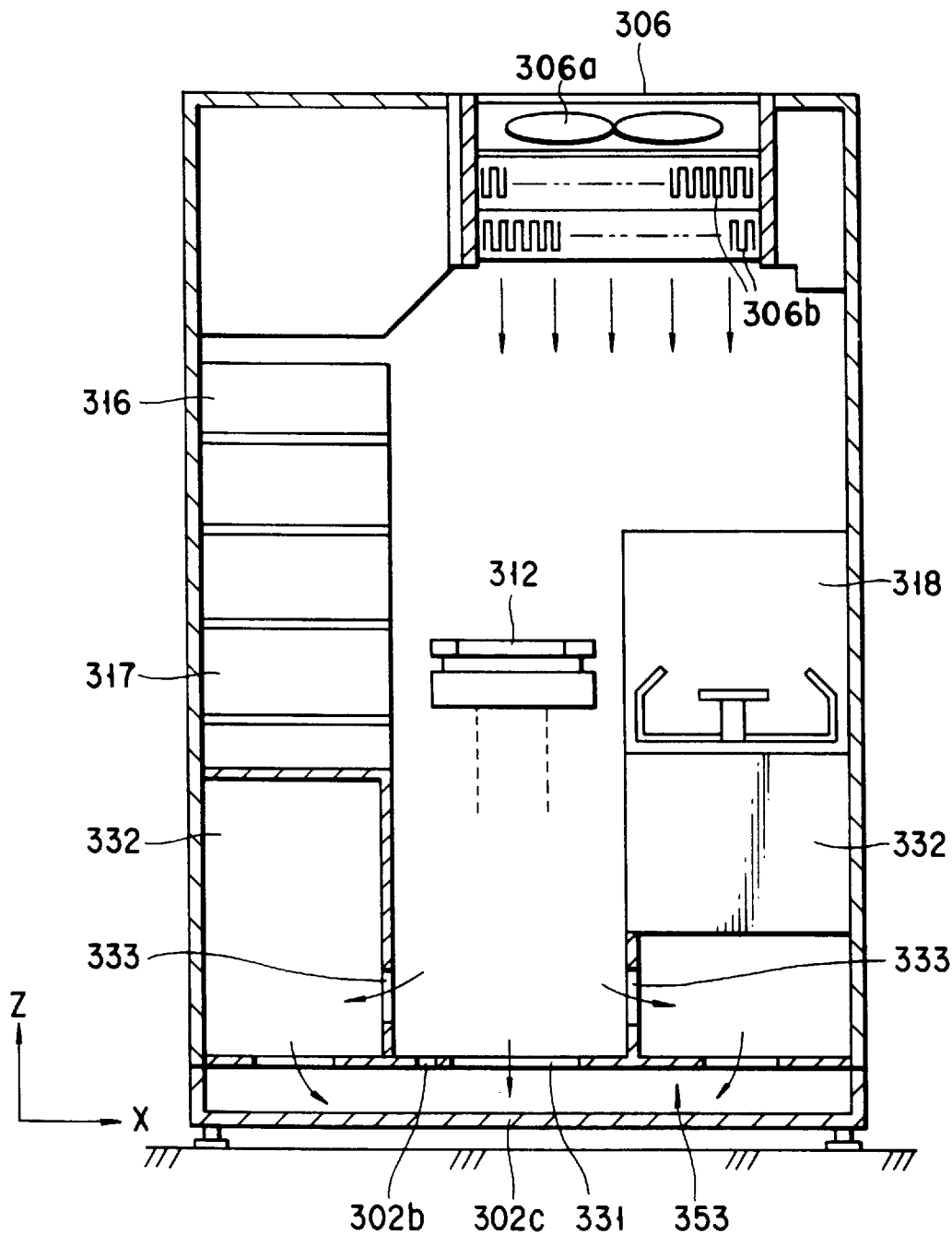
F I G. 21

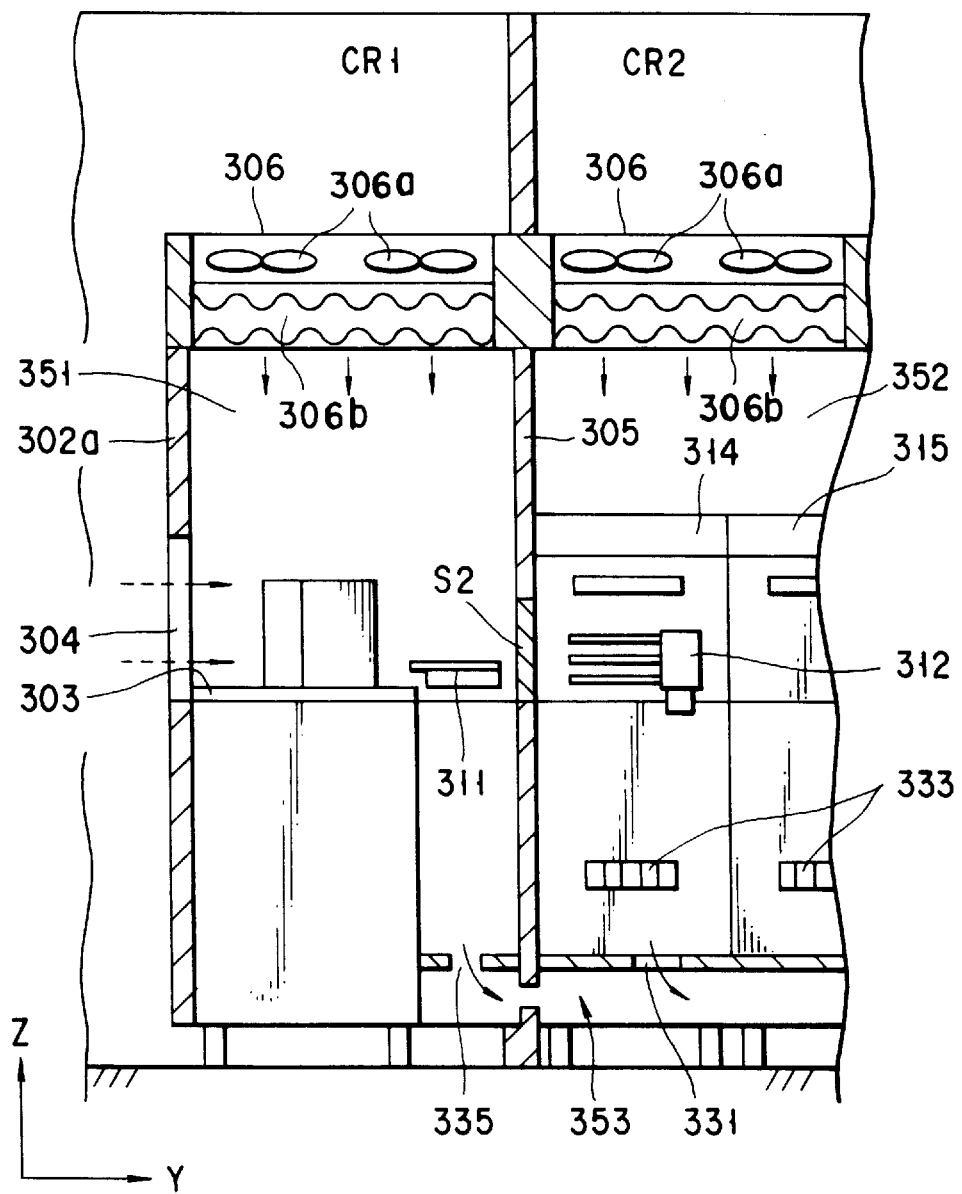
F I G. 25

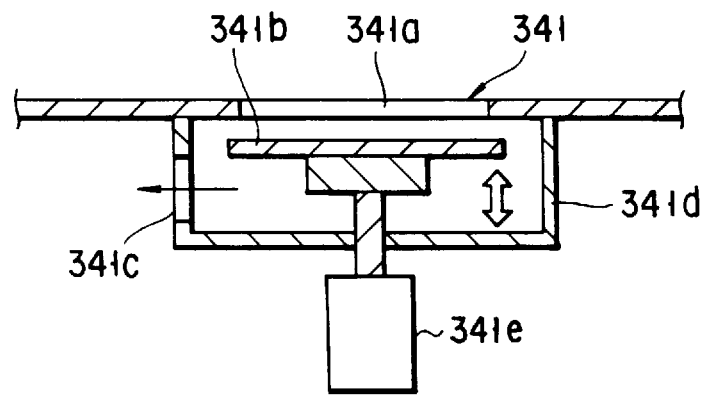
F I G. 27
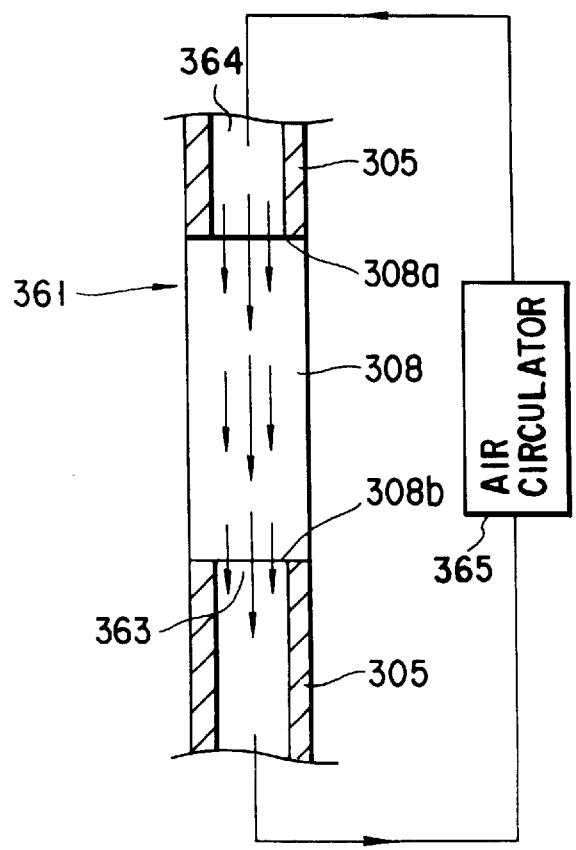
F I G. 28

SUBSTRATE TREATING SYSTEM AND SUBSTRATE TREATING METHOD

BACKGROUND OF THE INVENTION

The present invention relates to a substrate treating system and a substrate treating method for selectively coating a substrate such as a semiconductor wafer or a substrate of a liquid crystal display (LCD) device with resist to form a resist pattern, followed by developing the pattern.

FIG. 1 shows a conventional resist coating/developing system used in the photolithography process in the manufacture of a semiconductor device. As shown in the drawing, the conventional system comprises a cassette station 210, a process station 220 and an interface section 230. Semiconductor wafers W are put in or taken out of a cassette CR by a wafer transfer device 211 mounted in the cassette station 210. A series of treatments with resist are applied to the wafers W in the process station 220. Further, wafers W can be transferred between the interface section 230 and a light-exposure device (not shown) arranged adjacent to the interface section 230.

The treating system of the construction described above is arranged within a clean room in which a clean air forms a down-stream. A down-stream of clean air is also formed within the treating system, as denoted by arrows in FIG. 1. Specifically, air intake chambers 210a, 220a, 230a are formed above the cassette station 210, process station 220 and interface section 230, respectively. Further, ULPA filters 210b, 220b, 230b are arranged below the air intake chambers 210a, 220a, 230a, respectively. Also, treating spaces are formed below these ULPA filters. As seen from the drawing, a clean air flows downward from the air intake chambers 210a, 220a, 230a into treating spaces through the ULPA filters 210b, 220b, 230b, respectively. Further, the clean air flowing downward through the treating spaces is discharged to the outside through a large number of air outlet ports 240 appropriately formed in a lower portion of the treating system. Incidentally, the air outlet port 240 formed in the cassette station 210 alone is shown in FIG. 1. However, air outlet ports are similarly formed in each of the process station 220 and the interface section 230, though these air outlet ports are not shown in FIG. 1.

In the conventional treating system shown in FIG. 1, it is impossible to form a uniform down-flow of the clean air through each of the cassette station 210, the process station 220 and the interface section 230. For example, an open portion 212 for the worker is formed on the left side in the drawing of the cassette station 210. Since the down-flow of the clean air within the treating system is weakened in the vicinity of the open portion 212, the particles generated from the worker, etc. enter the cassette station 210 through the open portion 212, with the results that these particles are likely to be attached to the wafer W. In this case, it is difficult to prevent sufficiently the particles from entering the system even if the clean air supply rate into each of the air intake chambers 210a, 220a, 230a is increased.

Also, in order to increase the cleanliness of each of the cassette station 210, the process station 220 and the interface section 230, it is necessary to control the inner pressure of each of these cassette station 210, process station 220 and interface section 230 so as to stop air flow among these members 210, 220, 230 and to allow the clean air to flow from these members to a clean room positioned outside these members.

In the conventional treating system, the inner pressure of each of the cassette station 210, the process station 220 and the interface section 230 is controlled by manually controlling the clean air supply rate into each of the air intake chambers 210a, 220a, 230a. However, the inner pressure of the treating system is changed by various factors including, for example, the door-opening during maintenance of the treating system, leading to a change in the differential pressure between the clean room and the treating system. It follows that the particles are likely to enter the treating system. A differential inner pressure also takes place among the cassette station 210, the process station 220 and the interface section 230, with the result that the particles are likely to enter the adjacent member among these members 210, 220 and 230.

FIG. 2 shows another conventional treating system 401. As seen from the drawing, treating units 407, 408 and a main arm (main transfer means) 406 are arranged within a single casing 410 in this treating system. An opening (inlet-outlet port) 403 for transferring a carrier (cassette) C into or out of the casing 410 is formed in the casing 410. The carrier C transferred into the casing 410 is disposed on a carrier station (table) 404. Then, the wafer W is taken out of the carrier C by a sub-arm (sub-transfer means) 405 and, then, transferred from the sub-arm 405 to the main arm 406. Further, the wafer W is transferred by the main arm 406 into the treating units 407, 408 successively in accordance with a predetermined recipe.

It should be noted that the conventional treating system 401 shown in FIG. 2 extends over two clean rooms CR1 and CR2, as apparent from the drawing. The particular treating system is generally called a through-the-wall type. To be more specific, the system 401 shown in FIG. 2 extends over first and second clean rooms CR1 and CR2 which are separated from each other by a partition wall 402. The first clean room CR1 is called a working zone the inner space of which is controlled at a high cleanliness. The carrier C is transferred into the system 401 and a controller is operated by a worker or a transfer robot within the working zone. On the other hand, the second clean room CR2 is called a utility zone. The cleanliness within the second clean room CR2 is set lower than that within the first clean room CR1 used as the working zone.

A wafer transfer port 403 of the system 401 faces the first clean room CR1. A carrier C introduced into the treating system 401 through the transfer port 403 is disposed on a table 404. Under this condition, the wafer W is taken out of the carrier C by a sub-arm 405 and, then, transferred from the sub-arm 405 onto a main arm 406 for further transference of the wafer W into the treating unit 407 for liquid treatment and the treating unit 408 for heat treatment, successively.

Fan-filter units (FFU) 409 each consisting of an integral structure including a fan and a filter are arranged in an upper portion of the treating system 401. The FFU 409 serves to cleanse the air within the first and second clean rooms CR1, CR2 so as to permit a clean air to be introduced into the casing 410 and to form a down-flow of the clean air within the system 401 such that the particles are substantially prevented from being attached to the wafer.

In the substrate treating system of the through-the-wall type, it is not absolutely necessary for the partition wall 402 to be positioned at the boundary between the carrier station 411 and the first process station 412. Specifically, a partition wall 402a may be used in place of the partition wall 402 such that the wall 402a forms a front wall of the system 410, as denoted by broken lines in FIG. 2. Alternatively, a partition wall 402b may be formed between the first process station 412 and the second process station 413, as denoted by broken lines.

When it comes to the substrate treating system of the through-the-wall type, the inner pressure of the first clean room CR1 used as a working zone is set higher by about 1.5 mm Aq (1.5 mm $H_2O$) than that of the second clean room CR2 used as a utility zone. As a result, formed is an air stream flowing from the wafer transfer port 403 toward the casing 410, even if a down-low of the clean air is formed by the FFU 409. It follows that the particles generated within the first clean room CR 1 are likely to flow into the treating units 407, 408 so as to be attached to the wafer W. Incidentally, these particles are likely to be generated when the carrier C is introduced into the system 410 and when the wafers W are taken out of the carrier C by the sub-arm 405.

In order to prevent the particle attachment problem, it is proposed to mount an openable door to close the transfer port 403 such that the transfer port 403 is kept closed except the time when the carrier C is transferred into or out of the treating system. Even in this case, however, the particles flow into the treating system through the transfer port 403 when the carrier C is transferred into or out of the treating system because the inner pressure of the first clean room CR1 is higher than that of the second clean room CR2.

BRIEF SUMMARY OF THE INVENTION

An object of the present invention is to provide a substrate treating system which permits effectively preventing the particles from entering the system without increasing the clean air supply rate into the system.

Another object is to provide a substrate treating method and system which permit preventing the particles from entering a process station when a cassette is transferred into or out of a cassette station and when the cassette is transferred between the cassette station and the process station.

According to a first aspect of the present invention, there is provided a substrate treating system for successively treating a plurality of substrates under an air-conditioned environment, comprising an outer casing having a cassette transfer port through which a cassette housing a plurality of substrates is transferred into and out of the outer casing; a cassette section arranged within an inner space surrounded by the outer casing and including a cassette table on which the cassette transferred to the inner space surrounded by the outer casing is disposed; a sub-arm mechanism for taking out the substrates one by one from the cassette disposed within the cassette section; a process section arranged contiguous to the cassette section and having a plurality of treating units for treating the substrates; a main arm mechanism arranged within the process section for receiving the substrates from the sub-arm mechanism and for successively transferring the received substrates into the treating units, the treated substrates being successively transferred by the main arm mechanism out of the treating units; an air supply mechanism for supplying a clean air into the outer casing to form a down-stream of the clean air within the outer casing; and a partition plate for partitioning the inner space surrounded by the outer casing to prevent the down-flow of the clean air formed within one partitioned region from interfering with that formed within another partitioned region, the partition plate having a substrate transfer port for transferring the substrate between the adjacent partitioned regions.

In the first aspect of the present invention summarized above, the flow of the clean air within the region partitioned by the partition plate is made uniform, making it possible to prevent the particles from entering the substrate treating system without increasing the flow rate of the clean air within the system.

According to a second aspect of the present invention, there is provided a substrate treating system for successively treating a plurality of substrates arranged within an air-conditioned clean room, comprising an outer casing having a cassette transfer port through which a cassette housing a plurality of substrates is transferred into and out of the outer casing; a cassette section arranged within an inner space surrounded by the outer casing and including a cassette table on which the cassette transferred to the inner space surrounded by the outer casing is disposed; a sub-arm mechanism for taking out the substrates one by one from within the cassette disposed within the cassette section; a process section arranged contiguous to the cassette section and having a plurality of treating units for treating the substrates; a main arm mechanism arranged within the process section for receiving the substrates from the sub-arm mechanism and for successively transferring the received substrates into the treating units, the treated substrates being successively transferred by the main arm mechanism out of the treating units; a plurality of air supply mechanisms for supplying a clean air into each of the cassette section and the process section to form a down-stream of the clean air within each of these sections; an air stream detecting means for detecting the condition of the clean air stream within at least two of the clean room forming an outer environment, the cassette section and the process section; and control means for controlling the air supply mechanisms based on the condition of the clean air stream detected by the air stream detecting means so as to control the flow rate of the clean air into at least one of the cassette section and the process section.

In the substrate treating system according to the second aspect of the present invention summarized above, the conditions of the air streams both inside and outside the system are detected. Also, the supply rates of the clean air supplied by the air supply mechanisms are controlled on the basis of the detected conditions of the air streams. It follows that it is possible to prevent the differential pressure between the inside and outside of the treating system from being changed. Further, the conditions of the air streams in the cassette section, the process section and the clean room are detected independently, and the supply rates of the clean air supplied by the air supply mechanisms are controlled on the basis of the detected conditions of the air streams. It follows that it is possible to prevent a differential pressure from being generated among different sections of the treating system.

According to a third aspect of the present invention, there is provided a method of successively treating a plurality of substrates within a process section surrounded by an outer casing provided with apertures communicating with a clean room, comprising the steps of (a) partitioning a second space in which the process section is arranged from a first space in which a cassette section is arranged with a partition plate provided with a substrate transfer port, (b) supplying a clean air into each of the first and second spaces to form a down-flow of the clean air within each of the first and second spaces, (c) transferring a cassette having a plurality of substrates loaded therein into the cassette section through the aperture of the outer casing, (d) taking the substrate out of the cassette positioned within the cassette chamber, (e) setting the inner pressure of the second space higher than that of the first space in preparation for transference of the substrate taken out of the cassette through the substrate transfer port made in the partition plate, and (f) transferring the substrate into the second space so as to treat the substrate in the process section.

Further, according to a fourth aspect of the present invention, there is provided a substrate treating system for successively treating a plurality of substrates arranged within an air-conditioned clean room, comprising an outer casing having a cassette transfer port through which a cassette housing a plurality of substrates is transferred into and out of the outer casing; a cassette section arranged within a first space surrounded by the outer casing and including a cassette table on which the cassette transferred into the outer casing through the cassette transfer port is disposed; a sub-arm mechanism arranged within the first space for taking out the substrates one by one from within the cassette disposed within the cassette section; a process section arranged within a second space surrounded by the outer casing and positioned adjacent to the cassette section and having a plurality of treating units for treating the substrates; a main arm mechanism arranged within the second space for receiving the substrates from the sub-arm mechanism and for successively transferring the received substrates into the treating units, the treated substrates being successively transferred by the main arm mechanism out of the treating units; a plurality of air supply mechanisms for supplying a clean air into each of the first and second spaces to form a down-flow of the clean air within each of the first and second spaces such that the inner pressure of each of the first and second spaces is higher than that of the clean room; a partition plate provided with a substrate transfer port communicating with each of the first and second spaces, the partition plate serving to partition the second space from the first space; first shutter means for opening/closing the cassette transfer port; and second shutter means for opening/closing the substrate transfer port made in the partition plate.

In the substrate treating system according to the fourth aspect of the present invention, the first and second shutters are opened and closed, respectively, when a cassette is transferred onto a cassette table. By contraries, the first and second shutters are closed and opened, respectively, when the substrate is transferred from the cassette into the second space within the outer casing. As a result, an air stream flowing directly from the clean room outside the outer casing into the second space is not formed, making it possible to prevent particles from entering the second space. Also, if the inner pressure of the second space is set higher than that of the first space when the first and second shutters are closed and opened, respectively, the particles are completely prevented from entering the second space having a process section arranged therein.

Further, it is desirable for at least one of the bottom and the side wall of the outer casing to be provided with an air passageway communicating with at least one of the first and second spaces within the outer casing. In this case, an exhaust control mechanism should desirably be used for controlling the air flow rate through the air passageway. The particular mechanism permits easily controlling the pressure difference between the first and second spaces. It should be noted that, if the inner pressure of each of the first and second spaces is set lower than that of the clean room, an air stream does not flow into the first and second spaces. Naturally, the particles do not flow from the clean room into the first and second spaces.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a perspective cross sectional view showing the flow of a clean air within the substrate treating system shown in FIG. 3, as seen in an X-axis direction;

FIG. 8 is a perspective cross sectional view showing a vertical partition plate, as seen from the front side, for partitioning the inner space of a cassette section;

FIG. 9 is a graph showing the relationship between the particle density and the flowing speed of air within the substrate treating system, covering the cases where the system is provided with a vertical partition plate as in the present invention and where the system is not provided with a vertical partition plate as in the conventional system;

FIG. 11 is a perspective plan view showing a substrate treating system provided with a vertical partition plate mounted in an interface section;

FIG. 21 is a vertical cross sectional view schematically showing the construction within the substrate treating system;

FIG. 25 is a perspective cross sectional view showing the cassette section and a part of the process section in the step of transferring a cassette into the system;

FIG. 27 is a vertical cross sectional view showing another exhaust mechanism; and FIG. 28 schematically shows an air curtain mechanism for closing the substrate transfer port.

DETAILED DESCRIPTION OF THE INVENTION

Figure 1:
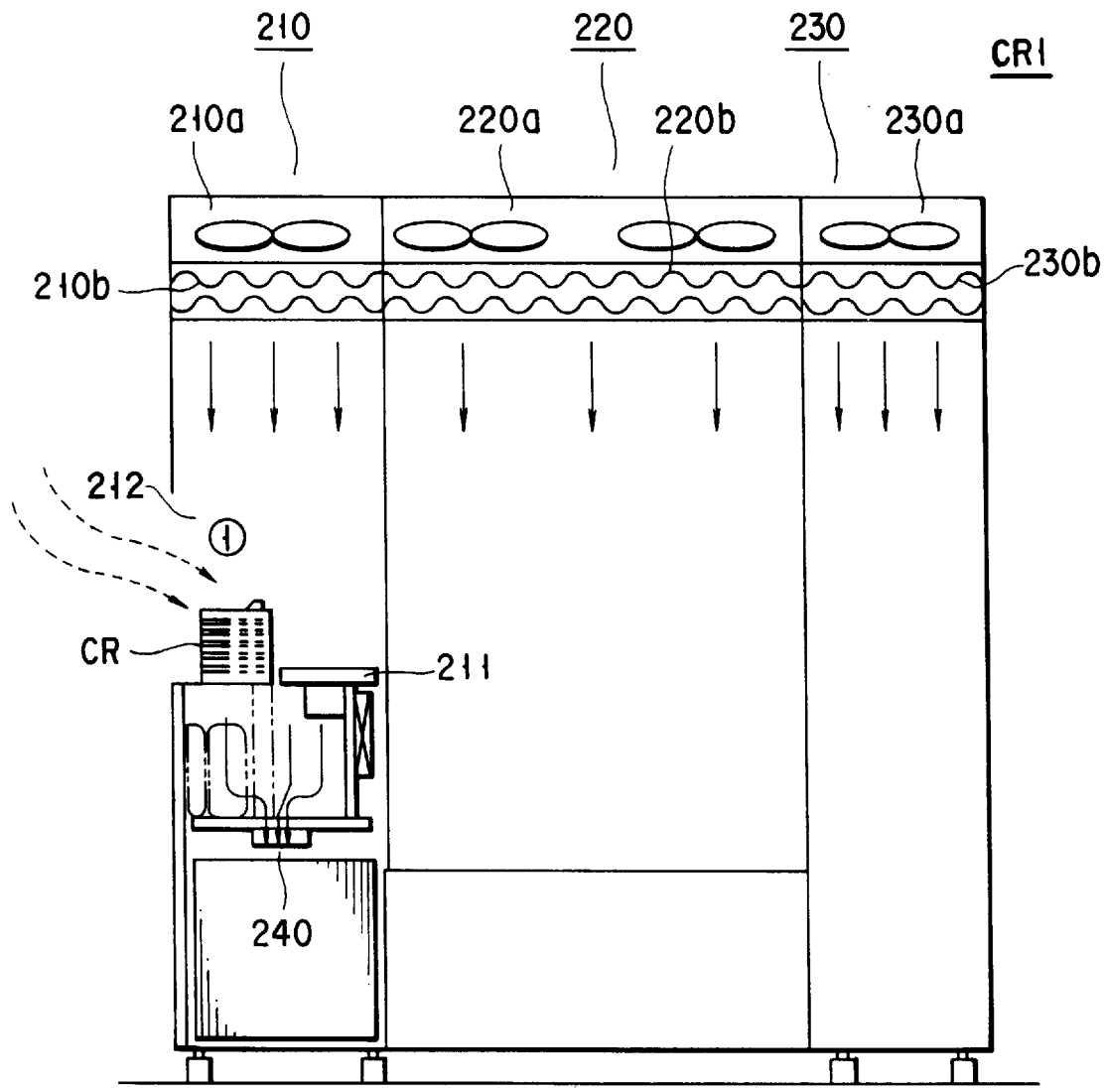
FIG. 1 is a perspective cross sectional view schematically showing a conventional substrate treating system.
Figure 2:
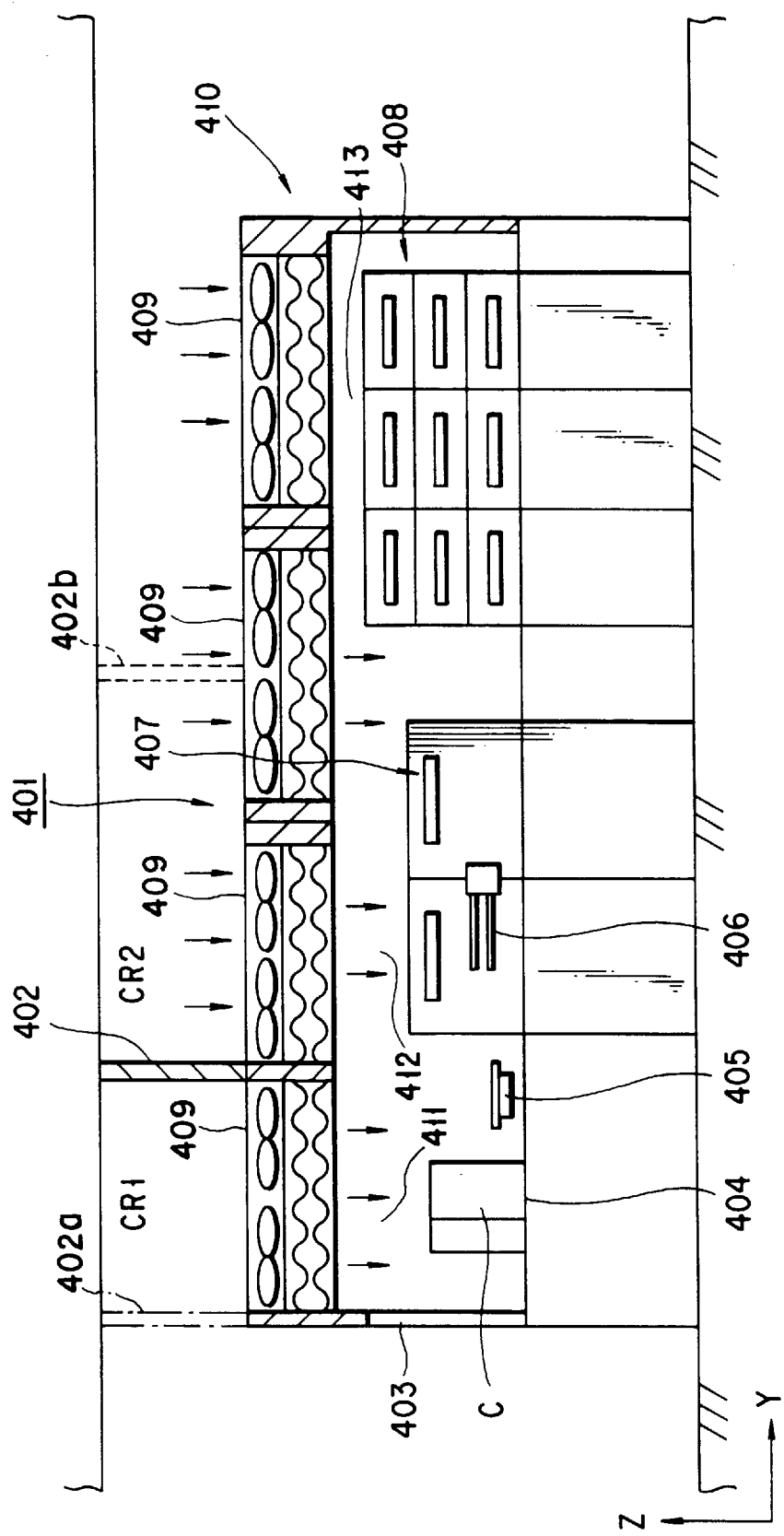
FIG. 2 is a perspective cross sectional view schematically showing a conventional substrate treating system of through-the-wall type.

Let us describe various embodiments of the present invention with reference to the accompanying drawings.

First of all, FIGS. 3 to 9 collectively show a substrate treating system 100 according to a first embodiment of the present invention. The system 100 is constructed to permit a plurality of semiconductor wafers W to be taken successively into the system for a simultaneous treatment of these wafers W in a plurality of process units. The entire region of the substrate treating unit 100 is covered with an outer casing 100a except an aperture (cassette transfer port) 100b for transfer of a cassette housing the wafers W. A cassette section 10, a process section 12 and an interface section 14 are included in the substrate treating system 100. The cassette section 10 is provided with a cassette table 20 and a first sub-arm mechanism 22.

The cassette transfer port 100b, which is open in the front wall of the cassette section 10, is sized to permit a cassette CR to be inserted by a transfer robot (not shown) or a worker (not shown) into and out of the cassette section 10.

At most 4 wafer cassettes CR each housing 25 wafers W can be disposed on the cassette table 20. The cassette CR housing the wafers W is transferred into or out of the cassette section 10. In other words, the wafers W are transferred together with the cassette CR. Incidentally, the cassette CR is disposed on the cassette table 20 to permit the wafers W housed therein to assume a horizontal posture.

A plurality of treating units for treating the wafers W in the resist coating-developing step are arranged in the process section 12. Each of these treating units consists of a group of non-heat treating systems (liquid treating system), in which the wafer W is coated with resist and the coating is developed with a developing solution, and a group of heat treating systems, in which the wafer W is heated or cooled.

One side of the interface section 14 is positioned adjacent to the process section 12, with the other side being positioned adjacent to a light-exposure device 99. A second sub-arm mechanism 26 for transferring the wafer W to and from the main arm mechanism 24 is arranged within the interface section 14.

Figure 3:
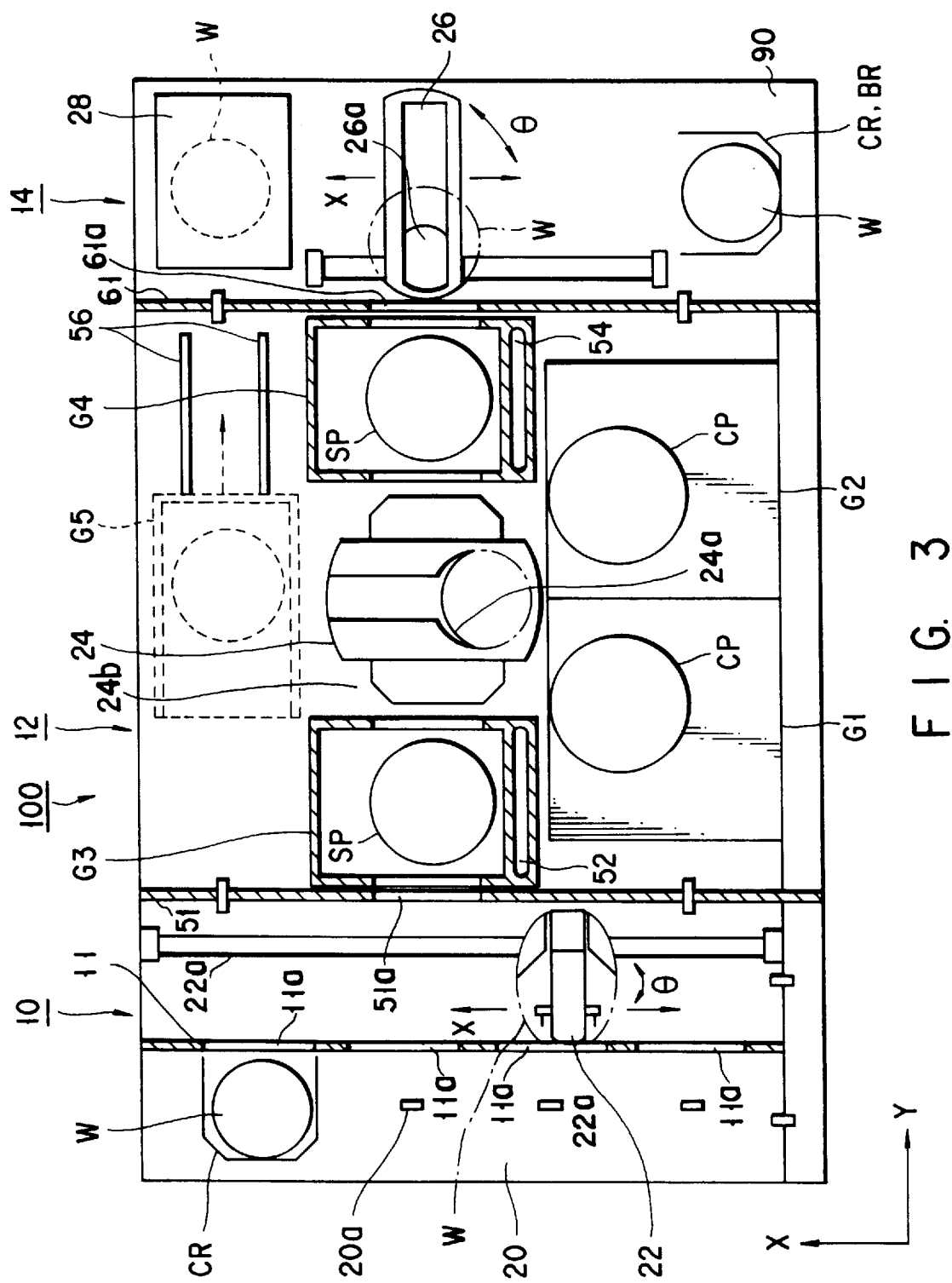
FIG. 3 is a perspective plan view showing the entire construction of a substrate treating system according to one embodiment of the present invention.

As shown in FIG. 3, four projections 20a are formed on the cassette table 20 within the cassette section 10. Each of these projections 20a permits the cassette CR to be positioned accurately on the cassette table 20. The cassette CR is disposed on the cassette table 20 such that the opening through which the wafers W are transferred faces the process section 12. Also, when the cassette CR is disposed on the cassette table 20, the wafers W within the cassette CR are allowed to assume a horizontal posture.

An X-axis rail 22a extends substantially parallel with the cassette table 20. A first sub-arm mechanism 22 is movable behind the cassette table 20 along the X-axis rail 22a. The first sub-arm mechanism 22 is also movable in a Y-axis direction and swingable about a Z-axis by an angle θ. Further, the first sub-arm mechanism 22 is capable of getting access to an alignment unit (ALIM) and an extension unit (EXT), which belong to a multi-stage structure of treating units of a third group G3 on the side of the process section 12, and will be described herein later in detail.

As shown in FIG. 3, a vertical passageway 24b having the main arm mechanism 24 mount ed therein is formed in a central portion of th e process section 12. The main arm mechanism 24, which is equipped with an XY-axes driving means, a Z-axis driving means and a driving means for swinging by an angle θ, is capable of a vertical movement, swinging and a horizontal movement within the vertical passageway 24b. All the treating units forming a plurality of groups are arranged to surround the vertical passageway 24b. In this embodiment, first to fifth groups G1, G2, G3, G4 and G5 each including a series of treating units are arranged to surround the vertical passageway 24b of the main arm mechanism 24. The treating units in each group are arranged to form a multi-stage structure. As shown in FIG. 1, the first and second groups G1 and G2 are arranged side by side in the front region of the treating system. The third group G3 is positioned adjacent to the cassette section 10, with the fourth group G4 being positioned adjacent to the interface section 14. Further, the fifth group G5 is arranged on the back side of the treating system.

Figure 4:
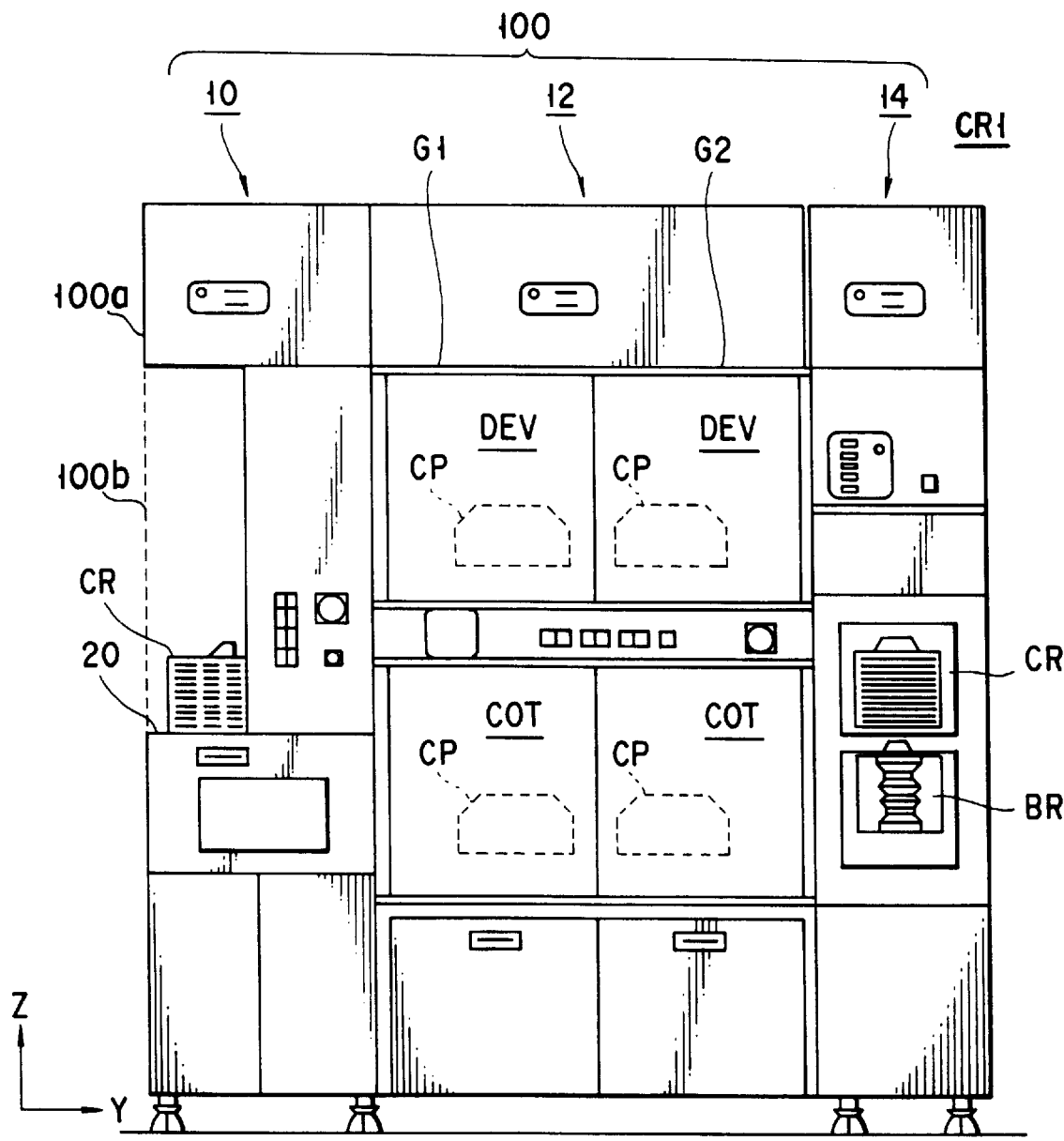
FIG. 4 is a side view showing the entire construction of the substrate treating system shown in FIG. 3.

FIG. 4 shows that two spinner type treating units, in which wafers W supported on a spin chuck are subjected to predetermined treatments within a cup CP, e.g., treating units consisting of a resist coating unit (COT) and a developing unit (DEV) superposed on the coating unit (COT), are arranged to form the first group G1. Likewise, two spinner type treating units consisting of, for example, a resist coating unit (COT) and a developing unit (DEV) superposed on the coating unit (COT) are arranged to form the second group G2. It is desirable to arrange the resist coating unit (COT) below the developing unit (DEV) in order to facilitate the disposal of the waste resist solution and to facilitate the maintenance of the apparatus. However, it is possible to arrange the resist coating unit (COT) above the developing unit (DEV), if necessary.

Figure 5:
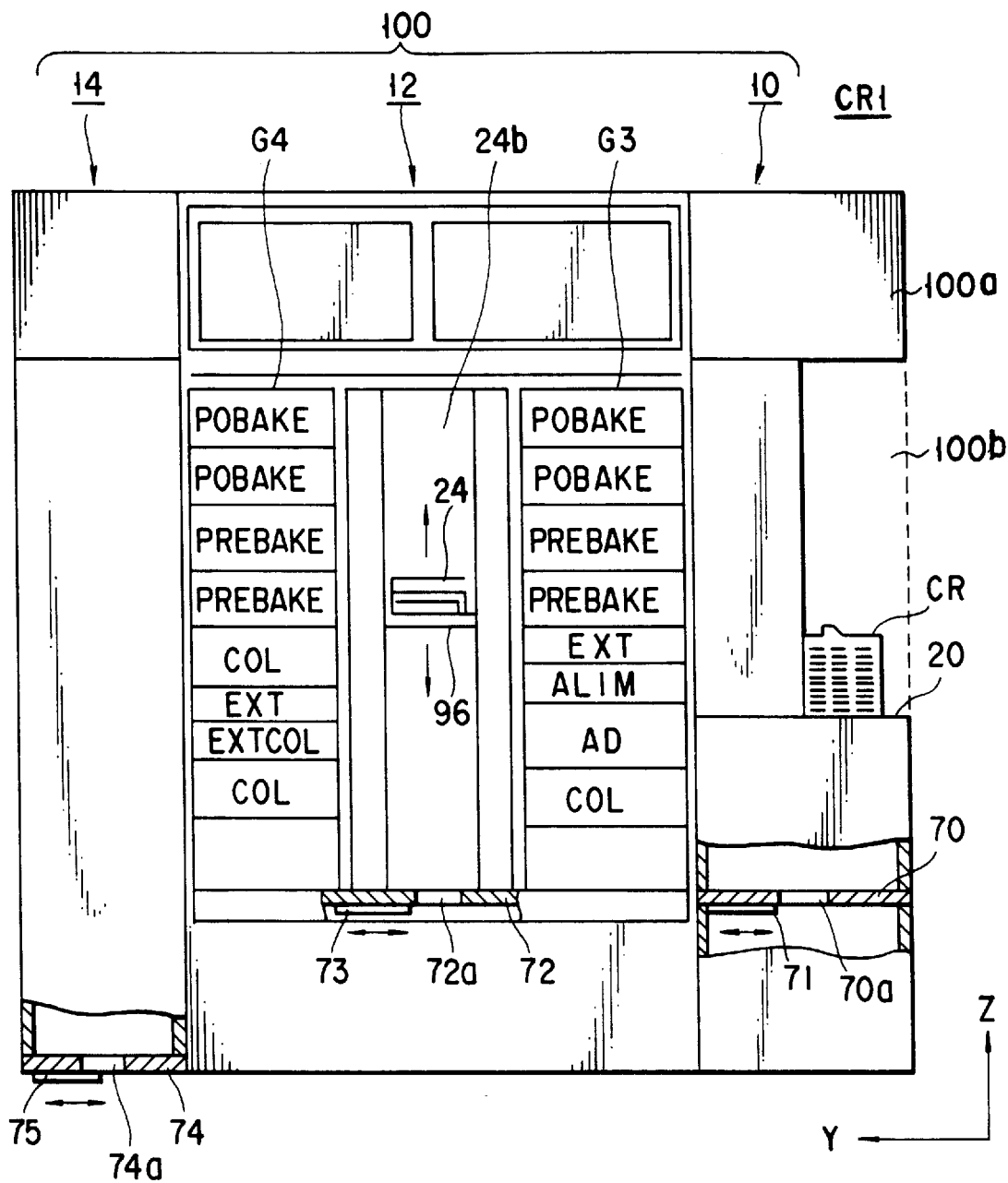
FIG. 5 is a back view showing the entire construction of the substrate treating system shown in FIG. 3.

As shown in FIG. 5, the third group G3 is of eight-stage structure consisting of an oven type treating unit for applying a predetermined treatment to the wafer W put on a table SP, e.g., a cooling unit (COL), an adhesion unit (AD) disposed on the cooling unit (COL), an alignment unit (ALIM) disposed on the cooling unit (COL), an extension unit (EXT) disposed on the adhesion unit (AD), two prebaking units (PREBAKE) disposed on the extension unit (EXT), and two post baking units (POBAKE) disposed on the upper prebaking unit (PREBAKE). Likewise, the group G4 is of eight-stage structure consisting of an oven type treating unit, e.g., a cooling unit (COL), an extension cooling unit (EXTCOL) disposed on the cooling unit (COL), an extension unit (EXT) disposed on the extension cooling unit (EXTCOL), a cooling unit (COL) disposed on the extension unit (EXT), two prebaking units (PREBAKE) disposed on the extension unit (EXT), and two post baking units (POBAKE) disposed on the upper prebaking unit (PREBAKE). It should be noted that the treating units involving a low treating temperature such as the cooling unit (COL) and the extension cooling unit (EXTCOL) are arranged in the lower stages in each of groups G4 and G5. On the other hand, the treating units involving a high treating temperature such as the prebaking unit (PREBAKE), the post baking unit (POBAKE), and the adhesion unit (AD) are arranged in the upper stages. The particular arrangement permits suppressing the mutual thermal interference among the treating units. Incidentally, if each of these treating units is sufficiently heat-insulated, these heating type treating units can be arranged at random.

The interface section 14 is sized equal to the process section 12 in the X-axis direction, but is sized smaller than the process section in the Y-axis direction. A stationary buffer cassette BR and a movable pick-up cassette CR are arranged one upon the other in the front portion of the interface section 14. Also, a peripheral light-exposure device 28 is disposed in a back portion of the interface section 14. Further, a second sub-arm 26 is arranged in the central portion of the interface section 14.

The second sub-arm 26 is movable in the X-axis and Y-axis directions so as to reach the cassettes CR, BR and the peripheral light-exposure device 28. Further, the second sub-arm 26 is swingable by an angle θ about the Z-axis. It follows that the second sub-arm 26 is also movable to reach the extension unit (EXT) included in the multi-stage treating units of the fourth group G4 on the side of the process section 12 and a wafer transfer table (not shown) on the side of an adjacent exposure device 99.

The substrate treating system 100 shown in the drawings is arranged within a clean room in which a clean air flows downward. The down-flow of the clean air is also formed independently within each of the cassette section 10, the process section 12 and the interface section 14 included in the system 100.

FIG. 5 shows that an air passage port 70a is formed in a lower portion 70 of the cassette section 100. The degree of opening of the air passage port 70a is controlled by a shutter 71. Another air passage port 72a is formed in a lower portion 72 of the process section 12. The degree of opening of the air passage port 72a is controlled by a shutter 73. Further, a still another air passage port 74a is formed in a lower portion (bottom portion) 74 of the interface section 14. The degree of opening of the air passage port 74a is controlled by a shutter 75. These air passage ports 70a, 72a, 74a and the shutters 71, 73 and 75 serve to control the air discharge rates from the cassette section 10, the process section 12 and the interface section 14 so as to maintain appropriately the inner pressure of each of these sections 10, 12 and 14. It should be noted that the inner pressure of the substrate treating system 100 is set higher than that of the clean room so as to prevent foreign matters such as particles from entering the system 100.

Figure 7:
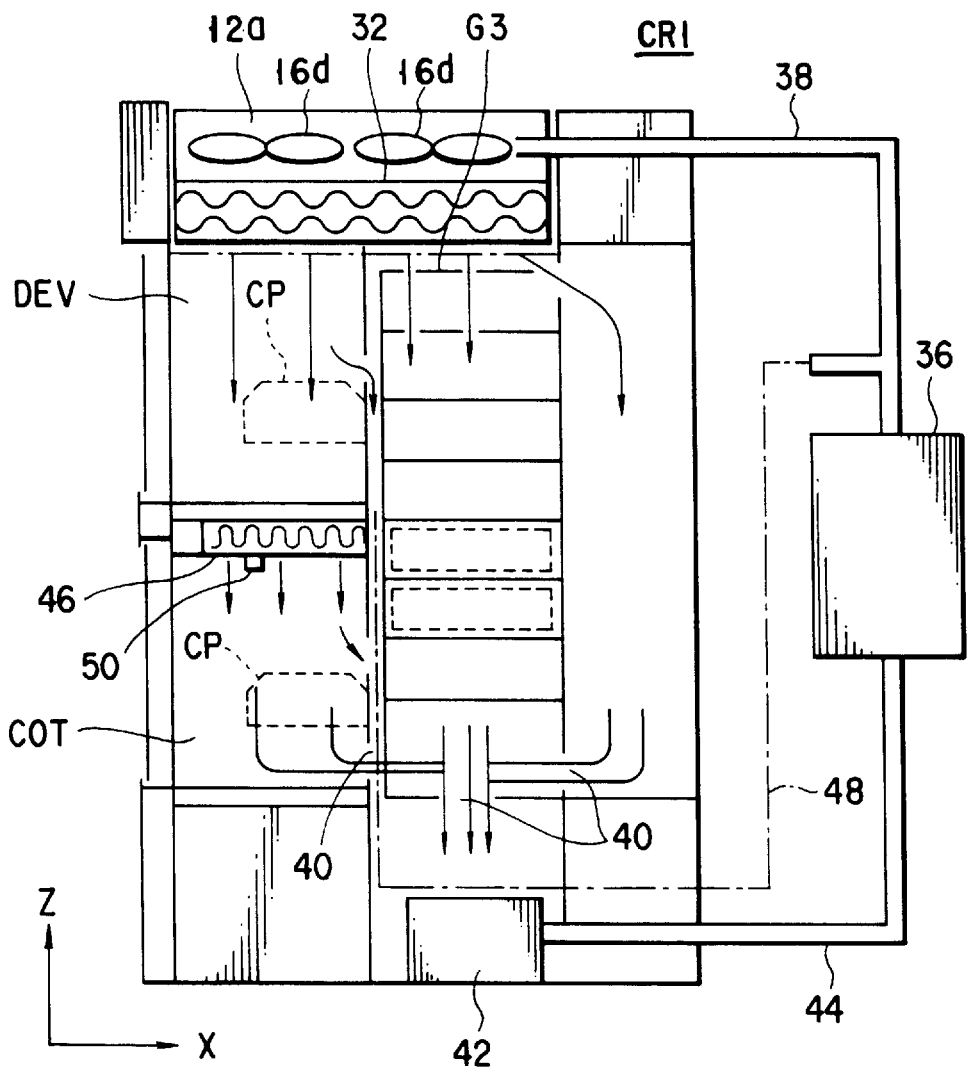
FIG. 7 is a perspective cross sectional view showing the flow of a clean air within the substrate treating system shown in FIG. 3, as seen in a Y-axis direction.

FIGS. 6 to 8 show how the clean air flows within the substrate treating system 100. Specifically, two air intake chambers 10a, 10b separated from each other by a partition plate 11 are formed in an upper portion of the cassette section 10, as shown in FIG. 6. A plurality of fans 16a are mounted in the air intake chamber 10a to blow a clean air downward. Likewise, a plurality of fans 16b are mounted in the air intake chamber 10b to blow a clean air downward. Also, ULPA filters 30, 31 for removing dust are mounted right under the air intake chambers 10a, 10b, respectively, so as to remove foreign matters such as particles from the air stream introduced into the substrate treating system 100.

The partition plate 11 extends downward to reach a region below the cassette section 10 so as to separate the inner space of the cassette section 10 into a front room and a rear room.

Figure 10:
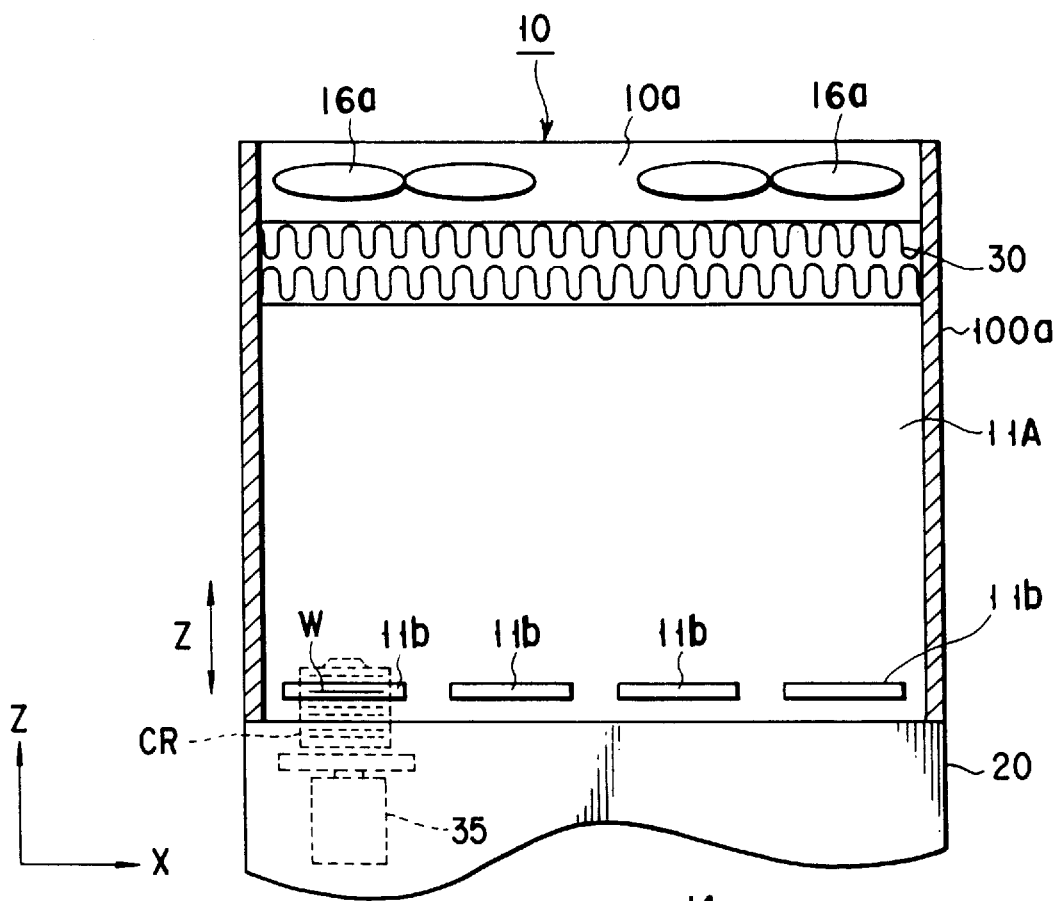
FIG. 10 is a perspective cross sectional view showing another vertical partition plate as seen from the front side.

As shown in FIG. 8, four transfer ports 11a are formed in a lower portion of the partition plate 11. Each of these transfer ports 1 ha is formed very close to the cassette CR disposed on the cassette table 20. A clean air introduced through the transfer ports 11a flows from the rear room into the front room of the cassette section 10. The clean air also flows through the clearances between adjacent wafers W housed in each of the cassettes CR. The open area of the transfer port 11a is larger than the area of the cassette CR projected onto the partition plate 11 and smaller than the sum of the areas of two cassettes CR projected onto the partition plate 11. In this case, it is possible to form small transfer ports 11b in the partition plate, as shown in FIG. 10, which will be described herein later in detail. As apparent from FIG. 10, the open area of the transfer port 11b is smaller than the area of the cassette CR projected onto the partition plate and larger than the area which barely permits passage of a single wafer W held by an arm.

The cassette section 10 and the process section 12 are separated from each other by another partition plate 51. Also, the process section 12 and the interface section 14 are separated from each other by still another partition plate 61. These partition plates 51, 61 are provided with openings 51a, 61a, respectively, for transfer of substrates.

Figure 15:
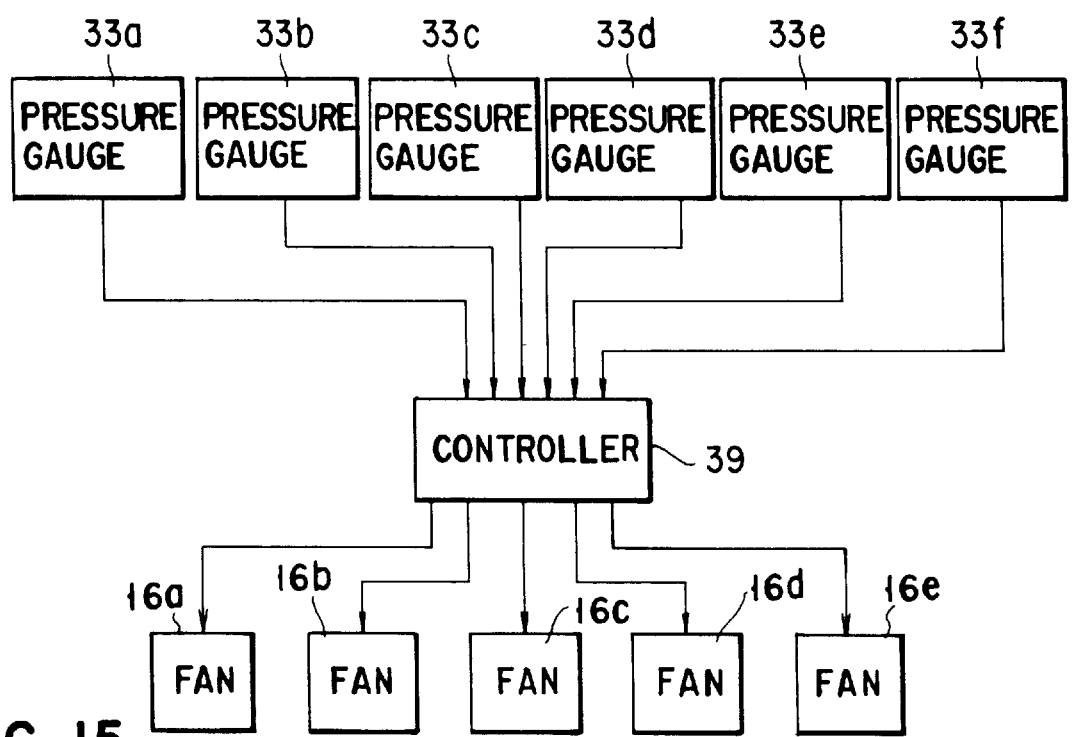
FIG. 15 is a block diagram showing a control system for controlling differences in pressure between the inner pressure of each section of the substrate treating system and the pressure outside the system.

Air intake chambers 12a, 14a are formed in upper portions of the process section 12 and the interface section 14, respectively. Two rows of fans 16c, 16d are mounted in the air intake chamber 12a of the process section 12. On the other hand, a single row of fans 16e are mounted in the air intake chamber 14a of the interface section 14. Further, ULPA filters 32, 34 for removing dust are mounted right under the air intake chambers 12a, 14a, respectively. Incidentally, it is possible to use chemical filters above the ULPA filters 30, 31, 32, 34 mounted right under the air intake chambers 10a, 10b, 12a, 14a. In the case of using a chemical filter, it is possible to remove alkali ions contained in the air stream so as to prevent a chemical sensitization type resist from being deteriorated. Further, the outputs of these fans 16a, 16b, 16c, 16d and 16e are controlled by a controller 39, as shown in FIG. 15.

FIG. 7 shows that an air conditioner 36 is arranged outside or behind the sections 10, 12, 14. The air conditioner 36 communicates with the air intake chambers 10a, 12a, 14a through a duct or pipe 38 so as to permit a clean air to be supplied into each of the cassette section 10, the process section 12 and the interface section 14 to form a down-flow within each of these sections. Further, a plurality of air passageways 40 communicating with a collective exhaust port 42 are formed in lower portions of these sections 10, 12 and 14. Further, the collective exhaust port 42 communicates with the air conditioner 36 through a duct or pipe 44.

The air streams within the sections 10, 12, 14 flow through the air passageways 40, the collective exhaust port 42 and the pipe 44 back into the air conditioner 36 so as to be cleansed within the air conditioner 36. Then, the cleansed air is supplied again into the air intake chambers 10a, 10b, 12a and 14a. In short, a clean air is kept supplied into the cassette section 10, etc. of the substrate treating system 100 by the air circulating circuit including the air conditioner 36. Incidentally, it is possible to cover the floor portion of each of the sections 10, 12 and 14 with a punched metal plate 82 and a grid 80, as shown in FIG. 6. In this case, the down-flow of the air passes through holes 80a and 82a of the grid 80 and the punched metal plate 82 so as to be recovered in the air conditioner 36.

As shown in FIGS. 6 and 7, a ULPA filter 46 is arranged on the ceiling of the resist coating unit (COT) positioned in the lowermost stage of the multi-stage treating units of each of the first and second groups G1 and G2 mounted within the process section 12. A fresh clean air is supplied from the air conditioner 36 to the filter 46 via a branched pipe 48 which is branched from the pipe 38 (main pipe). Temperature-humidity controllers (not shown) are mounted to appropriate points of the branched pipe 48 so as supply a clean air having the temperature and humidity controlled at desired levels to the resist coating unit (COT).

A temperature-humidity sensor 50 is mounted in the vicinity of the blowing port of the filter 46. The temperature-humidity sensor 50 is connected to the input side of a controller 39 shown in FIG. 15. The controller 39 serves to control the temperature and humidity of the air introduced into the system at appropriate values based on the temperature and humidity detection signals fed back from the sensor 50 and the optimum temperature and humidity set in advance.

As shown in FIG. 6, a plurality of openings DR through which the wafers W and the transfer arm 24a are moved are formed in the side walls of the spinner type treating units (COT) and (DEV) such that these openings DR are aligned in the direction of the Y-axis. Each of these openings DR is provided with a shutter (not shown) so as to prevent particles or contaminants in each treating unit from entering the main arm mechanism 24.

FIG. 3 shows that a vertical duct 52 is buried in the side wall of the multi-stage treating units (oven type treating units) of the third group G3. Likewise, a vertical duct 54 is buried in the side wall of the multi-stage treating units (oven type treating units) of the fourth group G4. A down-flow of the clean air or the air having the temperature especially controlled passes through each of these vertical ducts 52, 54. It should be noted that the clean air circulated within these ducts 52, 54 permits the treating units of the third and fourth groups G3, G4 to be thermally insulated from the treating units of the first and second groups G1, G2.

In this substrate treating system 100, a free space is provided behind the main arm mechanism 24, as denoted by broken lines in FIG. 3. A multi-stage treating units of a fifth group G5 can be arranged in the particular free space. The treating units of the fifth group G5 are movable along a guide rail 56 extending in the direction of Y-axis. It follows that the multi-stage treating units of the fifth group G5, even if mounted in the system 100, can be moved along the guide rail 56 so as to ensure a space required for the maintenance of the main arm mechanism 24.

FIG. 6 shows that, in the cassette section 10, the space above the cassette table 20 is separated from the moving space of the first sub-arm mechanism 22 by the partition plate 11. As a result, the down-flow of the clean air supplied from the first air intake chamber 10a passes through a space separated from another space through which passes the down-flow of the clean air supplied from the second air intake chamber 10b.

As already pointed out and shown in FIG. 8, the partition plate 11 is provided with the four transfer ports (openings) 11a. Each of these transfer ports 11a is sized to barely permit transfer of a single cassette CR. The wafer W is put into and taken out of the cassette CR through the transfer port 11a by the first sub-arm 22.

A comparative test was conducted between the substrate treating system of the construction described above, which was provided with partition plates, and a system of control case, which was not provided with partition plates. Specifically, the particle density "number/cubic foot", i.e., the number of particles having a diameter of at least 0.1 $\mu$m which were present per 1 cubic foot of the inner volume of the system, was measured for each of the two systems noted above. In this comparative test, the number of the particles was measured near the blowing port of the filter, with the flowing speed of the air stream being changed in three stages of 0.16 m/sec, 0.50 m/sec and 0.72 m/sec. A three dimensional anemometer WA-390 manufactured by Kaijo Inc. and a breeze meter Model 6521 manufactured by Japan Canomax Inc. were used for measuring the flowing speed of the air within the system. Also, a precision micro-differential pressure gauge ISP-3-5S manufactured by Shibata Kagaku Kikai Kogyo Inc. was used for measuring a differential pressure between the process section 12 and the clean room. Further, a particle counter $\mu$LCP-110 manufactured by PMS Inc. was used for measuring the number of particles within the system. During the test, the pressure was controlled to substantially eliminate a differential pressure between the process section 12 and the cassette section 10. The results of the comparative test are shown in Tables 1, 2 and FIG. 9.

TABLE 1

| Air | Particle Density within Cassette Section (number/cubic foot) | |
| --- | --- | --- |
| Flowing Speed (m/sec) | No partition plate (control case) | With partition plate (preset invention) |
| 0.16 | 2100 | 1100 |
| 0.50 | 600 | 8 |
| 0.72 | 210 | 0 |

TABLE 2

| Differential pressure* | Particle Density at Point (a), (b), (c) shown in FIG. 6 (number/cubic foot) | | |
| --- | --- | --- | --- |
| (mmAq.) | Point (a) | Point (b) | Point (c) |
| 0.006 | 1100 | 1100 | 30 |
| 0.020 | 8 | — | — |
| 0.038 | 0 | 0 | 0 |

*Differential pressure between the process section 12 and the clean room

As seen from FIG. 6, point (a) given in Table 2 represents a point right above the cassette table 20. Point (b) represents a transfer port made in the partition plate. Further, point (c) represents a moving region of the first sub-arm mechanism 22.

FIG. 9 is a graph showing the relationship between the particle density (ordinate) and the air flowing speed within the system 100 (abscissa). Curve G in FIG. 9 covers the system without the partition plate (control case), with curve H covering the system 100 of the present invention including a partition plate.

As apparent from the experimental data, the system of the present invention including a partition plate permits markedly decreasing the particle density within the cassette section 10, compared with the control case without the partition plate. It has also been found that the inner space of the cassette section 10 can be made substantially free of particles by increasing the clean air supply rate into the cassette section 10. If the air supply rate into the cassette section 10 is excessively increased, however, particles are blown up from the bottom portion of the cassette section 10 by the strong down-flow of the air, leading to contamination of the wafer W. Naturally, the air supply rate into the cassette section 10 is required to fall within an appropriate range.

It should also be noted that, if the partition plate 11 is mounted within the cassette section 10, the number of particles present within the cassette section 10 can be markedly decreased, even if a differential inner pressure is diminished between the clean room and the cassette section 10. This clearly indicates that, if the partition plate 11 is mounted within the cassette section 10, the flow of the particles into the cassette section 10 can be effectively prevented without increasing the clean air supply rate into the cassette section 10.

Incidentally, it is possible to arrange a lift mechanism 35 within the cassette section 10 for vertically moving the cassette CR in the direction of Z-axis, as shown in FIG. 10. In this case, small transfer ports 11b are formed in the partition plate 11 so as to permit the first sub-arm mechanism 22 to transfer the wafers W into and out of the cassette CR through these transfer ports 11b. The open area of the transfer port 11b should be smaller than that of the transfer port 11a described previously. To be more specific, it is desirable for the open area of the transfer port 11b to barely permit passage of a single wafer W held by the first sub-arm mechanism 22. In this case, the free space above the cassette table 20 can be more effectively shielded from the moving space of the first sub-arm 22 by the partition plate 11, with the result that flow of the particles into the cassette section 10 can be more effectively prevented with a smaller supply rate of the clean air.

Figure 12:
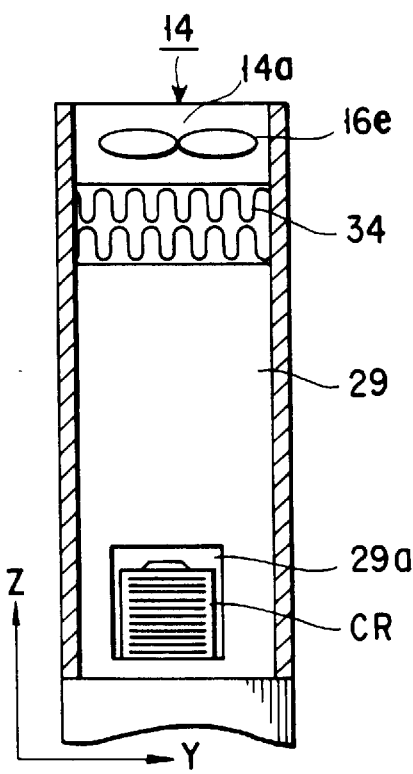
FIG. 12 is a perspective cross sectional view showing another vertical partition plate, as seen sideward, mounted in an interface section.

Of course, a vertical partition plate can also be mounted within the process section 12 or the interface section 14 in addition to the partition plate 11 mounted within the cassette section 10. For example, FIGS. 11 and 12 show that a vertical partition plate 29 extending in the direction of Y-axis is mounted within the interface section 14 such that the inner space of the interface section 14 is divided into a free space on the side of the second sub-arm mechanism 26 and a free space on the side of the cassettes CR and BR on a cassette table 90. In other words, the vertical partition plate 29 permits separating the moving space of the second sub-arm mechanism 26 from the space above the cassettes CR and BR, with the result that the down-flow of the clean air passes separately through each of the above-noted spaces.

As shown FIG. 12, the partition plate 29 is provided with a transfer port 29a through which the wafers W are transferred by the second sub-arm mechanism 26. The transfer port 29a is sized to barely permit passage of the cassette CR. The partition plate 29 is also provided with another transfer port (not shown) for transferring the cassette BR. Of course, the partition plate 29 also permits effectively preventing particles from entering the interface section 14 without increasing the clean air flow rate into the interface section 14.

Figure 13:
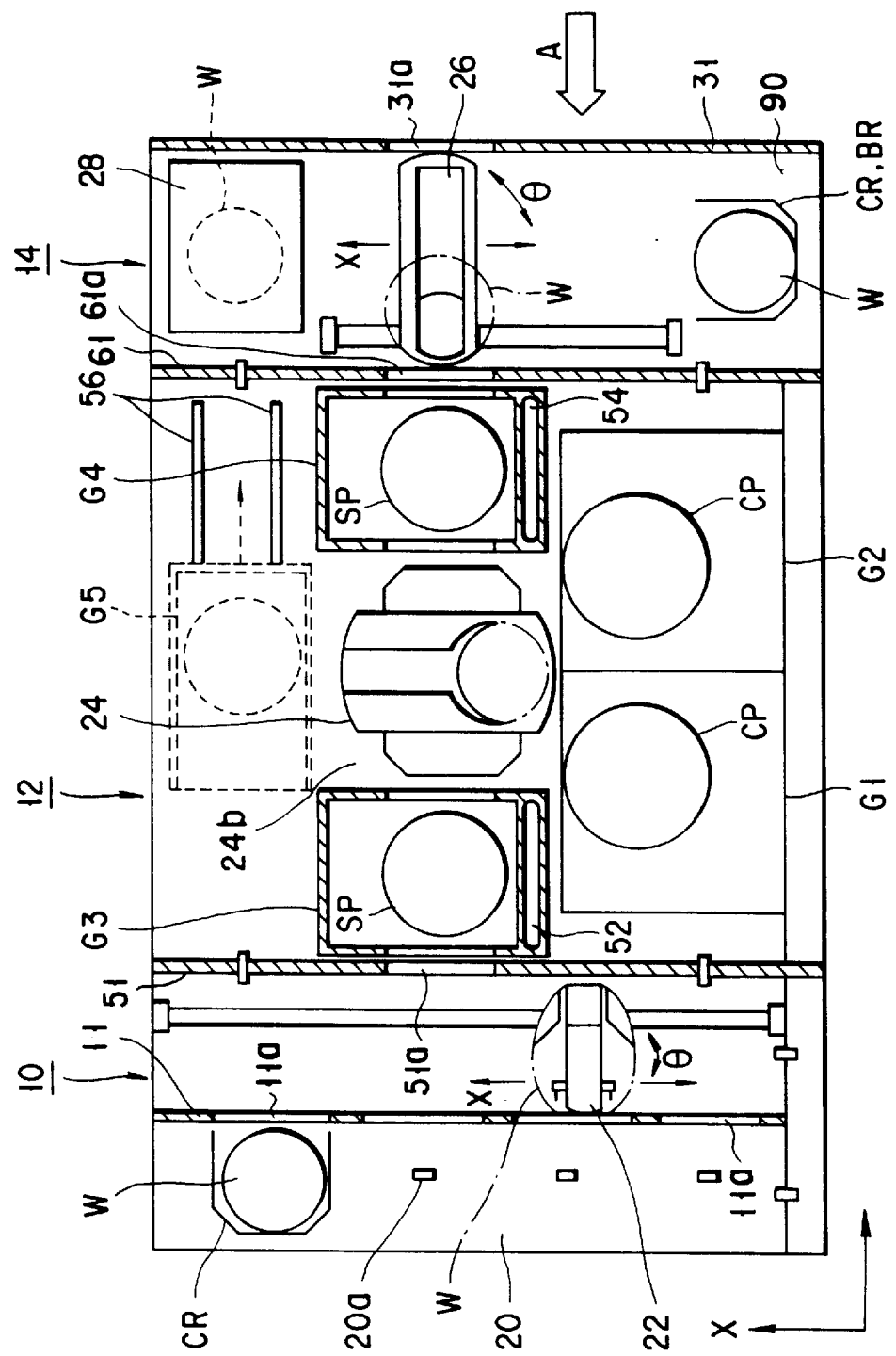
FIG. 13 is a perspective plan view showing a substrate treating system provided with another vertical partition plate mounted in an interface section.
Figure 14:
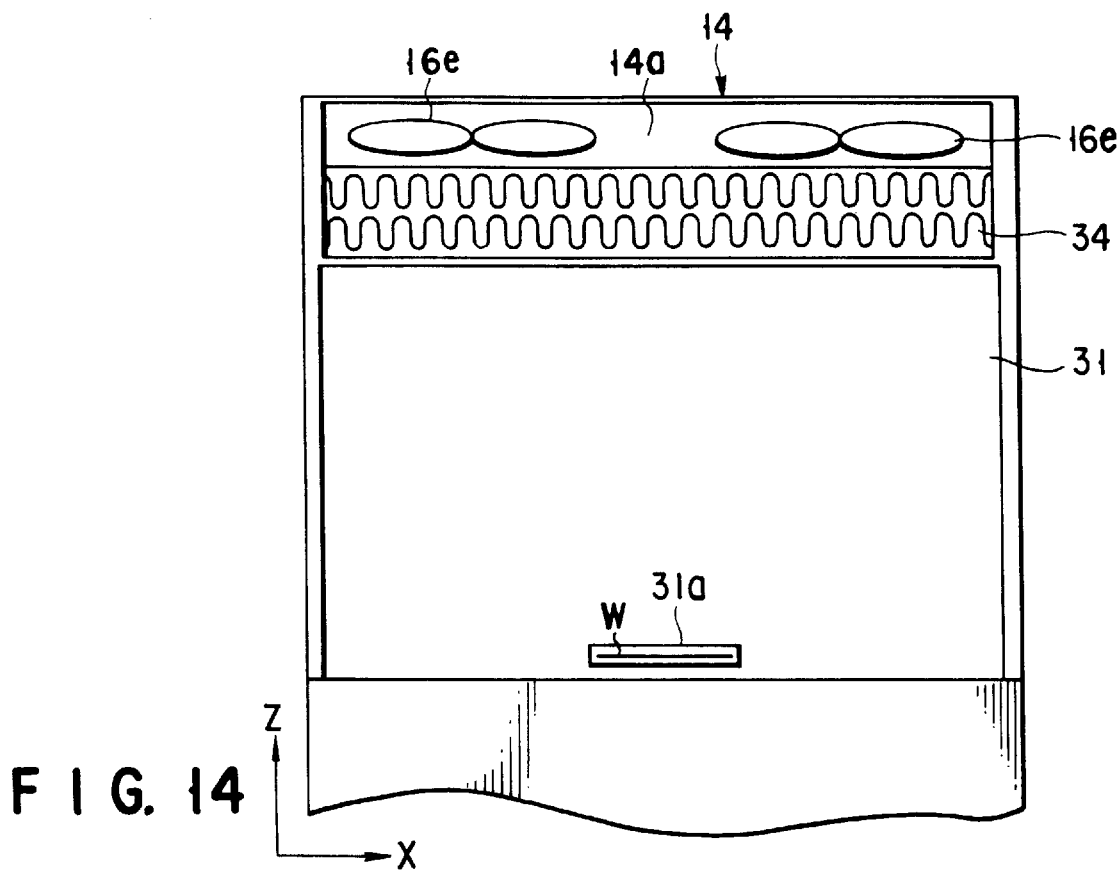
FIG. 14 is a perspective plan view showing another vertical partition plate, as seen from the back side, mounted in an interface section.

FIGS. 13 and 14 show another vertical partition plate 31. The partition plate 31 extends in the direction of X-axis for partitioning the interface section 14 from the exposure device 99, with the result that the interface section 14 is hardly affected by the exposure device 99.

As shown in FIG. 13, the partition plate 31 is provided with a transfer port 31a through which the wafer W is transferred by the second sub-arm mechanism 26. The transfer port 31a is sized to barely permit passage of the cassette CR.

The partition plate 31 also permits effectively preventing the particles from entering the interface section 14 without increasing the air supply rate into the interface section 14.

In the substrate treating system 100 of the present invention, a differential pressure among the cassette section 10, the process section 12 and the interface section 14 is controlled appropriately. Also, a differential inner pressure between these sections 10, 12, 14 and the clean room is controlled appropriately. As a result, the particles are prevented from entering any of the sections 10, 12 and 14.

As shown in FIG. 6, six pressure sensors 33a to 33f are mounted appropriately both inside and outside the system 100. For example, the first pressure sensor 33a is mounted outside the system 100 on the side of the cassette section 10 so as to detect the inner pressure of the clean room. The second pressure sensor 33b is mounted on one surface of the partition plate 11 so as to detect the inner pressure of the first space on the side of the cassette table 20 within the cassette section 10. The third pressure sensor 33c is mounted on the other surface of the partition plate 11 so as to detect the inner pressure of the second space on the side of the first sub-arm 22 within the cassette section 10. The fourth pressure sensor 33d is mounted on one surface of the partition plate 61 so as to detect the inner pressure of the process section 12. The fifth pressure sensor 33e is mounted on the other surface of the partition plate 61 so as to detect the inner pressure of the interface section 14. Further, the sixth pressure sensor 33f is mounted outside the system 100 on the side of the interface section 14 so as to detect the inner pressure of the exposure device 99 or the inner pressure of the clean room CR1. It is desirable to mount these pressure sensors 33a to 33f at positions very close to the transfer passageway of the wafers W. Incidentally, a digital micro differential pressure gauge DA manufactured by MODUS Inc. and/or a precision micro differential pressure gauge ISP-3-5S manufactured by Shibata Kagaku Kikai Kogyo Inc. and referred to previously is used as each of these pressure sensors 33a to 33f.

As seen from the block diagram shown in FIG. 15, these pressure sensors 33a to 33f are connected to the input side of the controller 39 which is backed up by a process computer system. On the other hand, the output side of the controller 39 is connected to the power sources switches for the fans 16a to 16e. As apparent from the diagram, the controller 39 serves to control the output of each of the fans 16a to 16e based on the differential pressure detection signals supplied from the sensors 33a to 33f. For example, the controller 39 serves to control the output of each of the fans 16a to 16e so as to prevent occurrence of an air stream among the cassette section 10, the process section 12 and the interface section 14 and another air stream flowing from these sections 10, 12, 14 toward the outside of the system 100. To be more specific, the controller 39 permits controlling the outputs of the fans 16a to 16e to meet formulas (1) and (2) given below:

$$P_{C/S1} = P_{C/S2} = P_{P/S} = P_{I/F} \tag{1}$$

$$P_{C/S1}, P_{C/S2}, P_{P/S}, P_{I/F} > P_{OUT1}, P_{OUT2} \tag{2}$$

where $P_{C/S1}$ is the pressure of the space above the cassette table 20 within the cassette section 10, $P_{C/S2}$ is the pressure of the moving space of the first sub-arm mechanism 22 within the cassette section 10, $P_{P/S}$ is the inner pressure of the process section 12, $P_{I/F}$ is the inner pressure of the interface section 14, $P_{OUT1}$ is the pressure outside the system 100 on the side of the cassette section 10, and $P_{OUT2}$ is the pressure in an upper portion of the wall outside the system 100 on the side of the interface section 14.

For example, where any of $P_{/C/S1}$, $P_{C/S2}$, $P_{P/S}$ and $P_{I/F}$ is lowered when the door is opened for the maintenance of the system 100, the controller 39 serves to increase the outputs of the fans 16a to 16e so as to satisfy the formulas (1) and (2) given above. As a result, the differential pressure between the inside and outside of the treating system 100 is not fluctuated so as to prevent the particles from entering the system 100. Also, where, for example, the pressure $P_{/I/F}$ within the interface section 14 is increased, the outputs of the fans 16a to 16d for the cassette section 10 and the process section 12 are increased so as to satisfy the formulas (1) and (2). As a result, a differential pressure is not generated among the cassette section 10, process section 12 and interface section 14, making it possible to prevent the particles from entering the process section 12.

Figure 16:
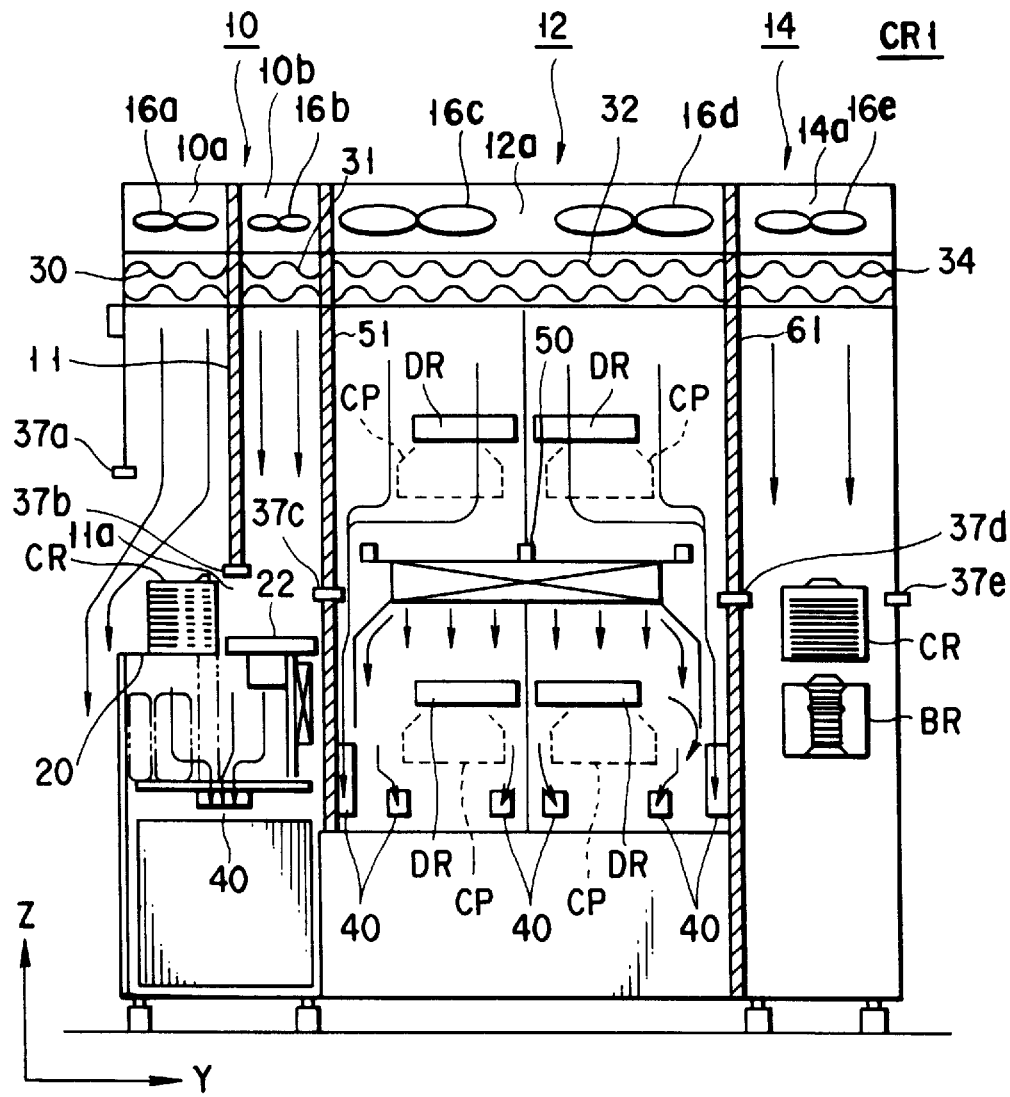
FIG. 16 is a perspective cross sectional view showing the flow of the clean air, as seen in the X-axis direction, within a substrate treating system according to another embodiment of the present invention.
Figure 17:
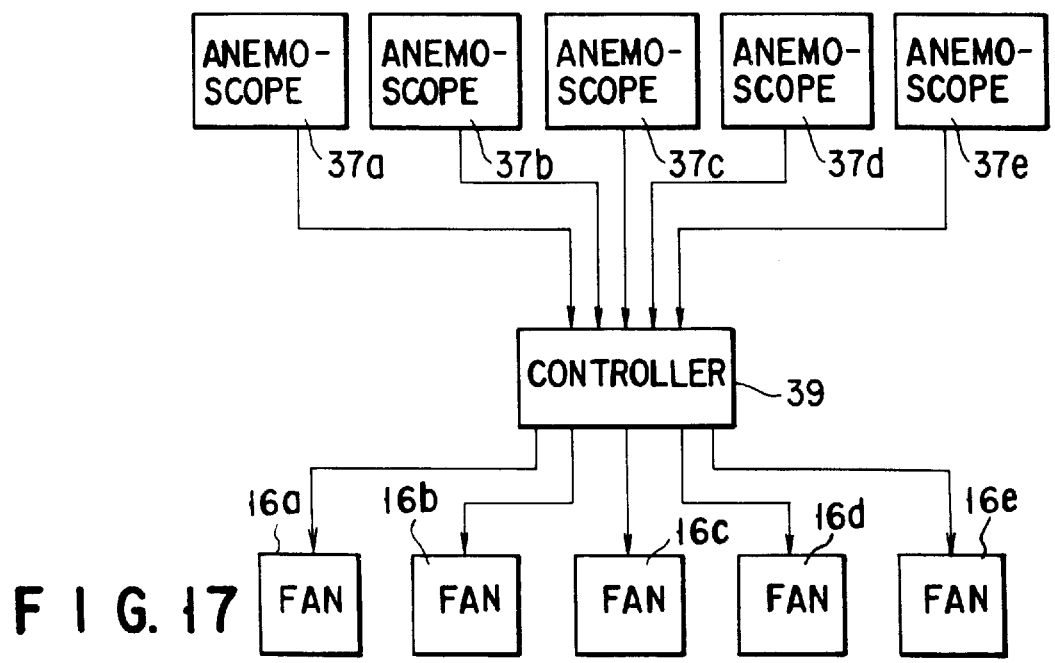
FIG. 17 is a block diagram showing another control system for controlling differences in pressure between the inner pressure of each section of the substrate treating system and the pressure outside the system.

FIGS. 16 and 17 show a modification in which an anemoscope is used as an air stream detecting means in place of the pressure gauge. As shown in FIG. 16, five anemoscopes 37a to 37e are mounted to the substrate treating system. Specifically, the first anemoscope 37a is mounted at the inlet port of the cassette section 10. The second anemoscope 37b is mounted at the lower end of the partition plate 11 within the cassette section 10. The third anemoscope 37c is mounted between the cassette section 10 and the process section 12. The fourth anemoscope 37d is mounted between the process section 12 and the interface section 14. Further, the fifth anemoscope 37e is mounted between the interface section 14 and the exposure device 99 or the clean room CR1. It is desirable to mount these anemoscopes at positions very close to the transfer passageway of the wafers W.

FIG. 17 shows that these anemoscopes 37a to 37e are connected to the input side of the controller 39. As apparent from the drawing, the controller 39 serves to control the outputs of the fans 16a to 16e based on the wind direction detecting signals generated from the anemoscopes 37a to 37d.

In the modification described above, the number of air stream detecting means can be decreased. Naturally, the number of parts included in the system 100 can be decreased. It is also possible to decrease the wiring within the system 100.

The arrangement of the various parts included in the embodiment described above is no more than an example. Of course, the arrangement can be modified in various fashions. For example, the partition plate can be mounted within the process section. Further, where the treating system comprises an additional transfer-process section to which a clean air is supplied independently, the partition plate may be mounted within the additional section.

In the embodiment described above, the supply rate of the clean air supplied by the air supply means is controlled by controlling the outputs of the fans 16a to 16e mounted within the air intake chambers 10a, 10b, 12a and 14a. Alternatively, an automatic pressure control valve may be mounted between the clean air supply main pipe 38 and each of the air intake chambers 10a, 10b, 12a and 14a. In this case, the clean air supply rate can be controlled by controlling the output of the air conditioner 36 and the automatic pressure control valves noted above.

The embodiment described above is directed to a resist coating-developing system used in the step of photolithography included in the manufacture of a semiconductor device. However, the technical idea of the present invention can also be applied to other treating systems. Also, the substrate to be treated is not limited to semiconductor wafers. Specifically, the technical idea of the present invention can also be employed for the treatment of, for example, substrates for LCD, glass substrates, CD substrates, photomasks, substrates for printed circuits, and ceramic substrates.

The substrate treating system of the present invention is effective for preventing the particles from entering the system without increasing the clean air supply rate into the system. Also, it is possible to control the system such that a differential pressure between the inside and outside of the system is not fluctuated, making it possible to prevent the particles from entering the system. Further, the particles in a certain treating section can be prevented from entering the adjacent section by independently controlling the air flow rates into the cassette section, process section and interface section such that a differential pressure will not be generated among these sections.

Figure 18:
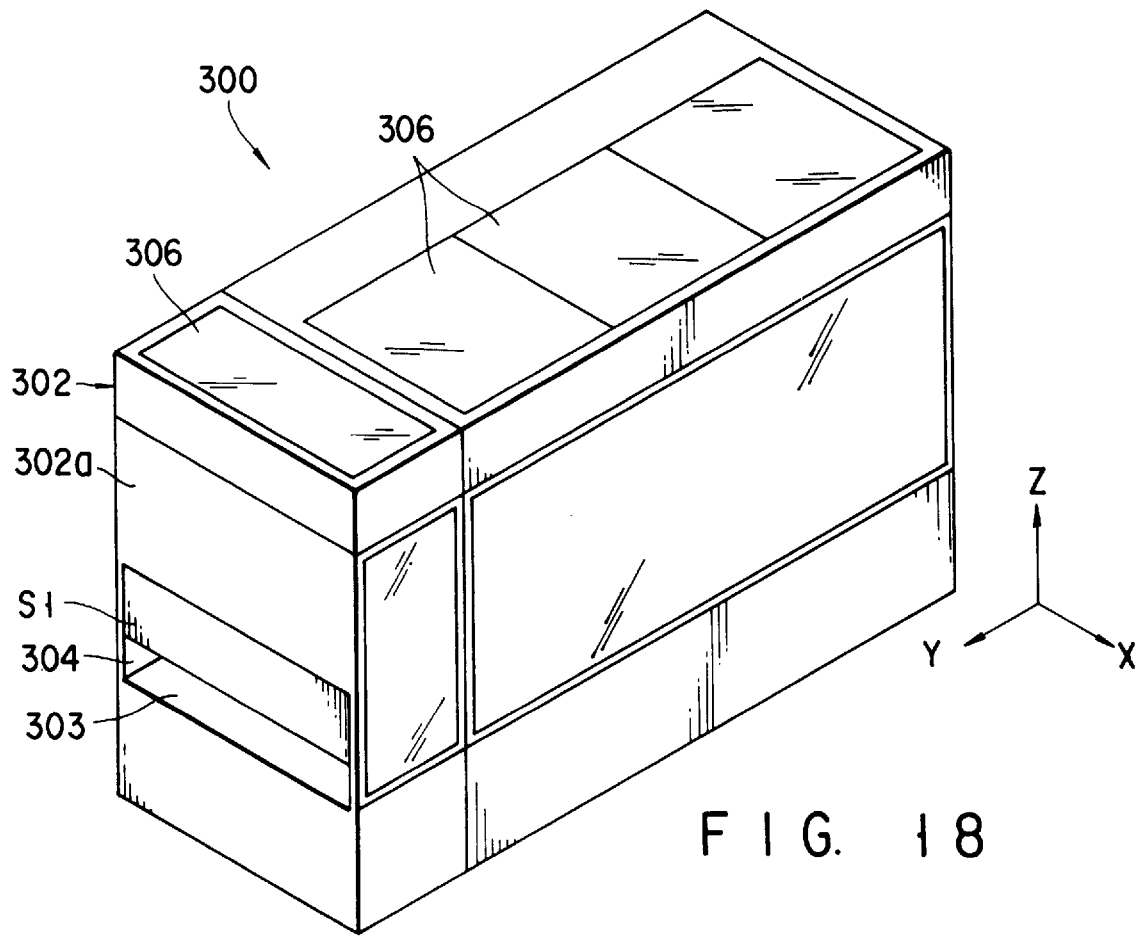
FIG. 18 is an oblique view showing the outer appearance of a through-the-wall type substrate treating system.
Figure 19:
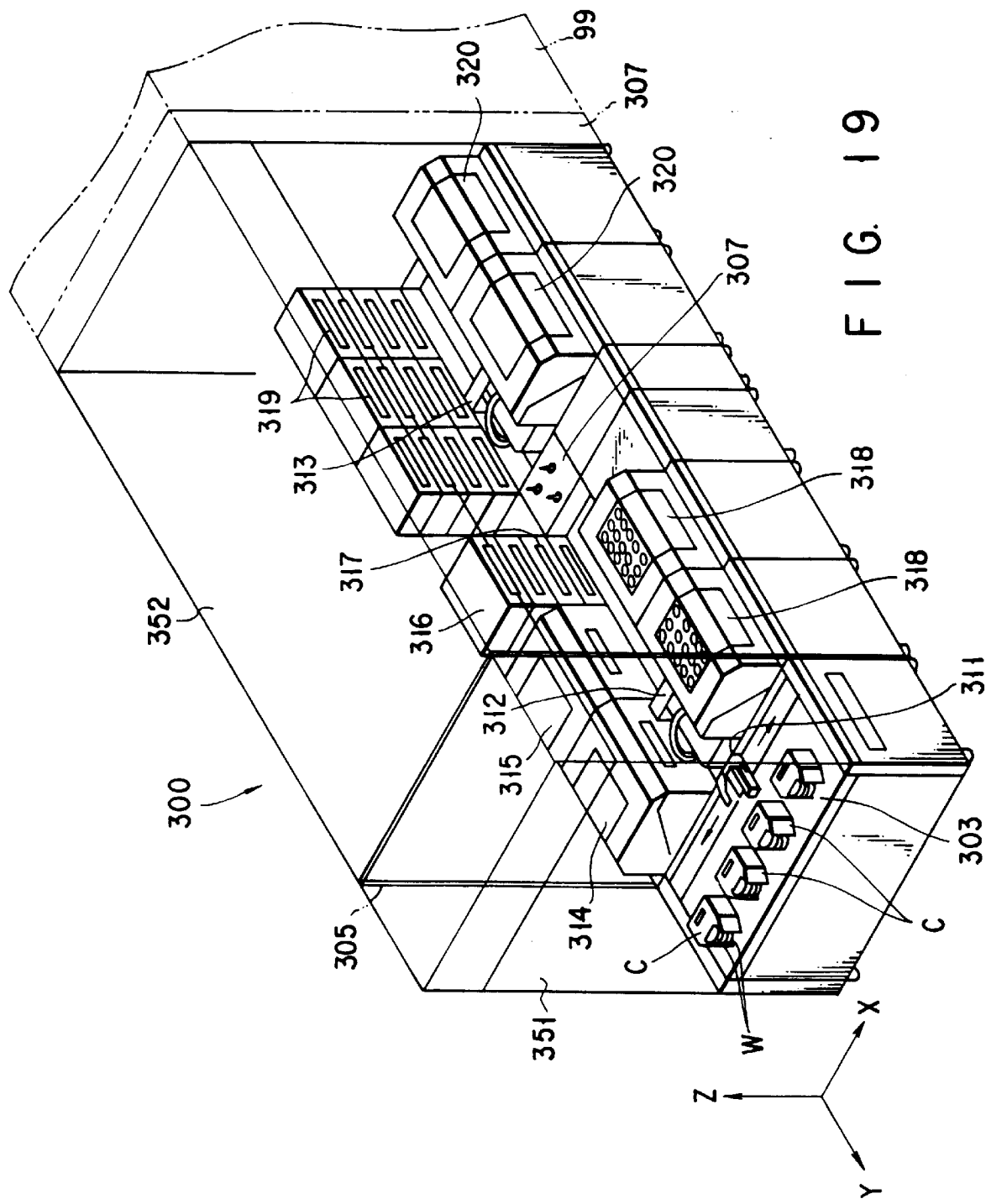
FIG. 19 is a perspective oblique view showing the construction within the through-the-wall type substrate treating system shown in FIG. 18.
Figure 20:
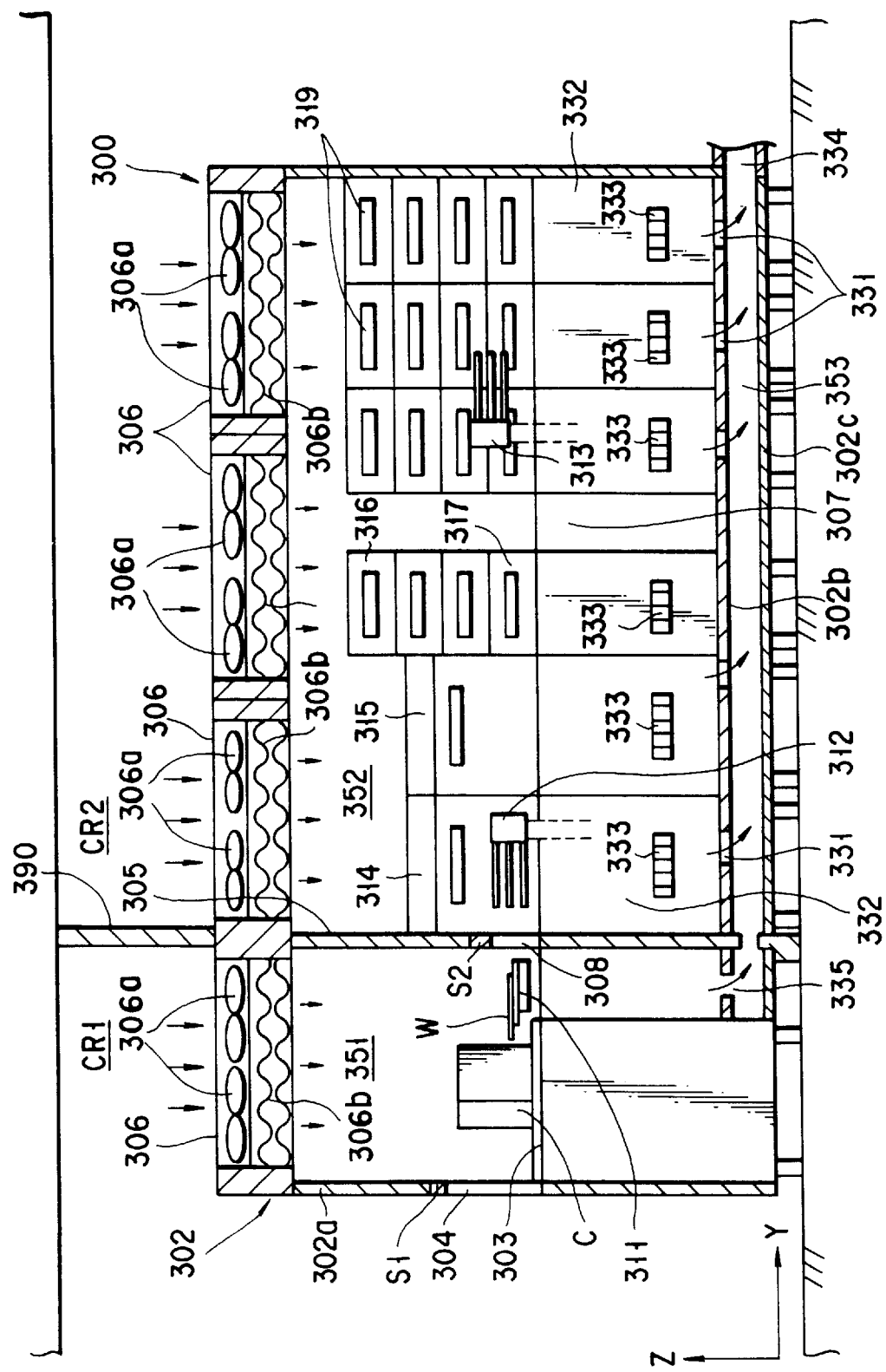
FIG. 20 is a perspective cross sectional view showing the construction within the through-the-wall type substrate treating system shown in FIG. 18.

FIGS. 18 to 28 collectively show a substrate treating system 300 of through-the-wall type including a plurality of treating units of the wafer W for washing, adhesion treatment, resist coating, heating, cooling and development. As shown in FIGS. 18 to 20, the system 300 is arranged to extend over two clean rooms CR1 and CR2 partitioned from each other by a wall 390. The entire system 300 is covered with an outer casing 302, and the inner space of the system 300 is partitioned into a cassette section 351 and a process section 352 by a partition plate 305.

A transfer port 304 is formed in a front panel 302a of the cassette section 351. A cassette C is transferred by a transfer device (not shown) onto or away from a cassette table 303 arranged within the cassette section 351 through the transfer port 304 which communicates with the atmosphere within the first clean room CR1.

A fan-filter unit (FFU) 306 is mounted in an upper portion of the cassette section 351 so as to introduce the clean air within the first clean room CR1 into the cassette section 351 through the FFU 306. Also, three FFU's 306 are arranged in upper portions of the process section 352 so as to permit the clean air within the second clean room CR2 to be introduced into the process section 352 through these FFU 306.

The FFU 306 comprises a fan 306a and a filter element 306b of two-stage structure positioned below the fan 306a. The power source switch for each fan 306a is connected to the output portion of a controller (not shown) so as to control the rotation of the fan 306a. These FFU's 306 serve to form down-flow of the clean air within each of the cassette section 351 and the process section 352.

A sub-arm mechanism 311 is formed together with the cassette table 303 within the cassette section 351 so as to permit the wafers W to be taken out of the cassette C one by one.

On the other hand, the process section 352 is positioned within the second clean room CR2. Various treating units 314 to 320 and two main arm mechanisms 312 and 313 are arranged within the process section 352.

Figure 22:
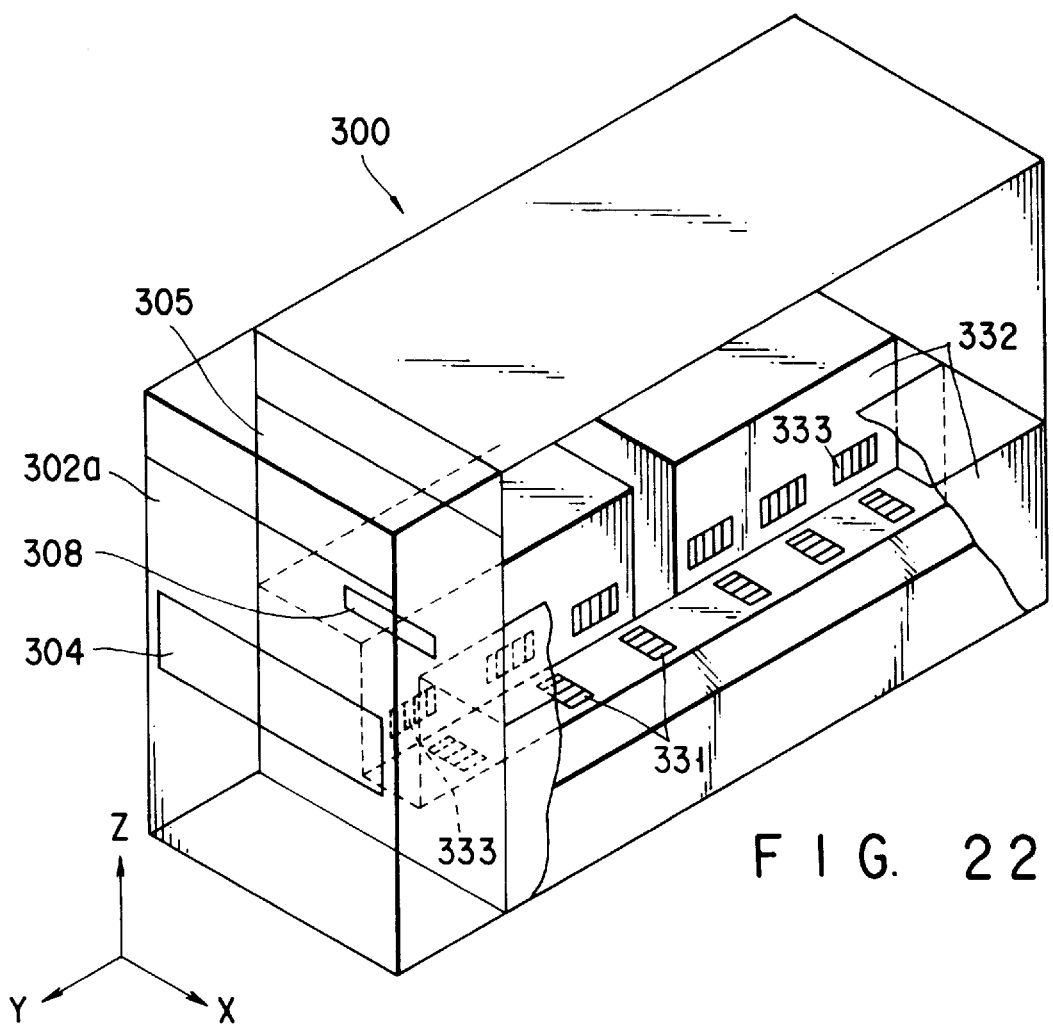
FIG. 22 is a perspective oblique view showing a through-the-wall type substrate treating system provided with a plurality of exhaust ports formed in the process section of the system.

As shown in FIG. 22, a transfer port 308 is formed in the partition plate 305 so as to permit transfer of the wafer W from the sub-arm mechanism 311 onto the first main arm mechanism 312 through the transfer port 308. The transfer port 308 is sized to barely permit transfer of a single wafer W held by the arm.

Arranged within the process section 352 are a brush-washing unit 314, a high pressure jet water washing unit 315, an adhesion unit 316, a cooling unit 317, a resist coating unit 318, a baking unit 319, and a developing unit 320. Transfer of the wafer W among these units are performed by the two main arm mechanisms 312 and 313.

FIGS. 18 and 20 show that a first shutter SI is mounted to close the transfer port 304. Likewise, a second shutter S2 is mounted to close the transfer port 308 formed in the partition plate 305. Operations of these shutters S1, S2 are controlled by a controller (not shown). The airtightness of the system 300 is not complete when the first shutter S1 is closed. In the present invention, it is allowable for the air within the system 300 to leak to the outside to some extent through the frame portion, when the shutter S1 is closed. Incidentally, the inner pressure of the outer casing 302 is set higher than that of each of the clean rooms CR1 and CR2.

As shown i n FIGS. 20 and 21, the bottom portion of the outer casing 302 is of a double-wall structure consisting of an upper plate 302b and a lower plate 302c. A plurality of exhaust ports 331 communicating with a factory ventilation system (not shown) via an exhaust space 353 are formed in the upper plate 302b. Further, a cabinet 332 is disposed on the upper plate 302b.

FIGS. 20 and 22 show that the treating units 314 to 320 are arranged on the cabinet 332. A plurality of exhaust ports 333 are formed in the side wall facing a main passageway of the cabinet 332. Each of these exhaust ports 333 also communicates with a factory ventilation system (not shown) via the exhaust space 353. The exhaust port 333 formed in the side wall is substantially equal in construction to the exhaust port 331 formed in the bottom (or floor) of the system 300.

Figure 23:
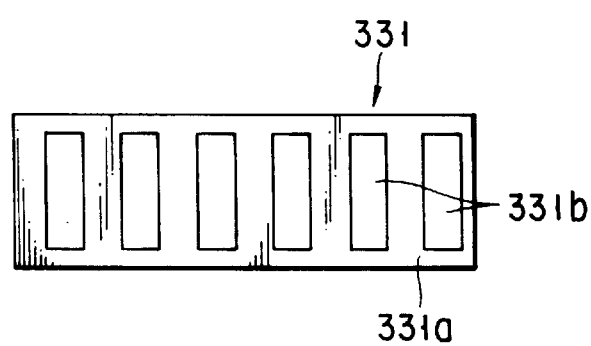
FIG. 23 is a front view showing an exhaust mechanism formed in the process section.
Figure 24:
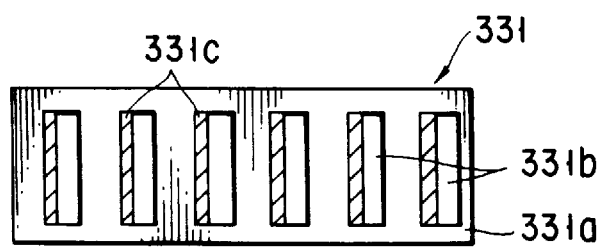
FIG. 24 is a front view showing the exhaust mechanism in which a shutter is half-opened.
Figure 26:
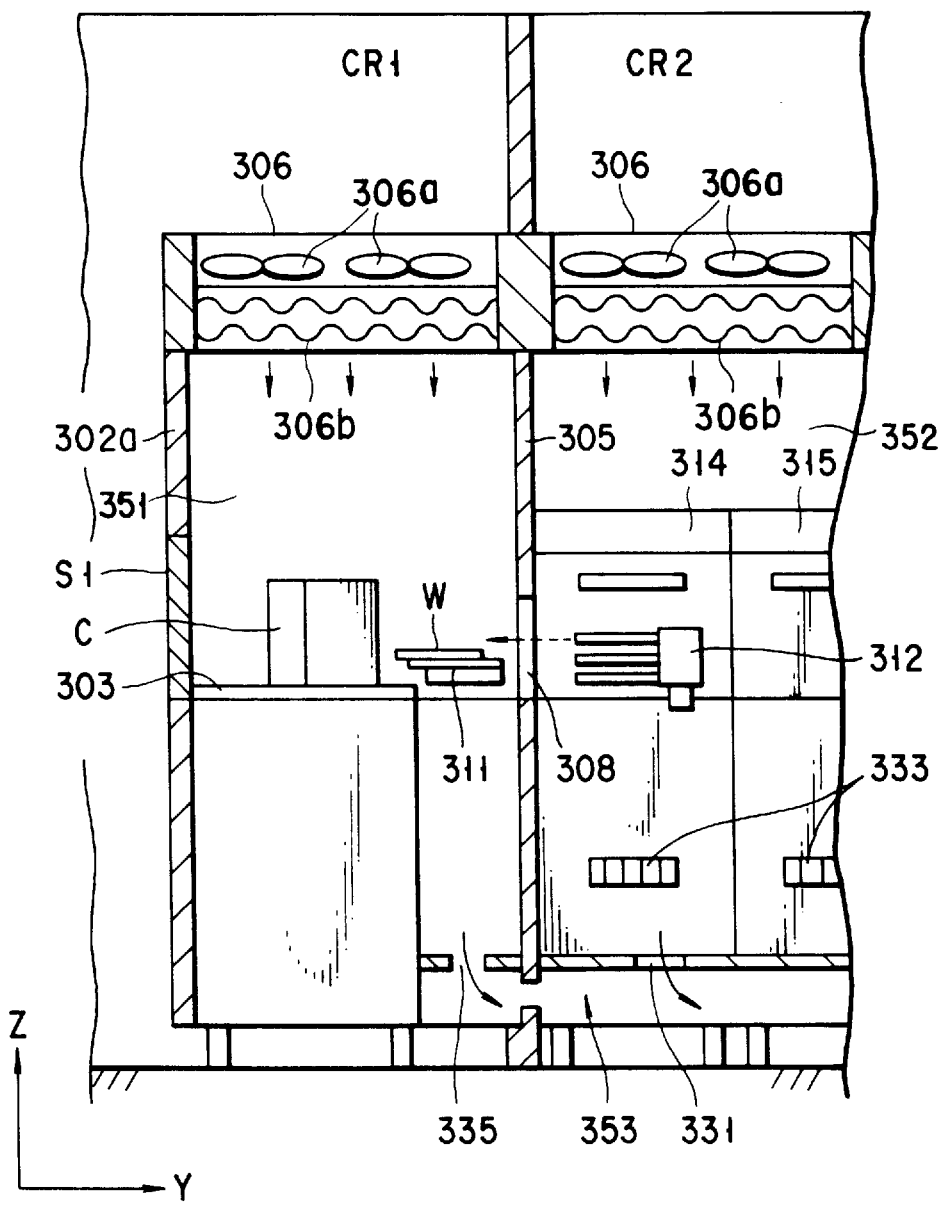
FIG. 26 is a perspective cross sectional view showing the cassette section and a part of the process section in the step of transferring wafers W.

As shown in FIG. 23, a grille 331a having a plurality of apertures 331b formed therein may be used as the floor exhaust port 331. Also, a shutter 331c may be formed to close the aperture 331b, as shown in FIG. 24. In this case, the exhaust amount per unit time can be controlled by adjusting the degree of opening of the shutter 331c. Of course, a similar mechanism may be mounted in the floor exhaust port 335 formed in the cassette section 351.

Where the cassette C is transferred into the cassette section 351 by a transfer robot (not shown) or a worker, the shutter S1 of the transfer port 304 is opened, with the shutter S2 of the transfer port 308 made in the partition plate 305 kept closed. The shutter S1 is closed immediately after the cassette C is transferred under this condition through the transfer port 304 onto the cassette table 303.

While the sub-arm 311 is moved to take the wafer W out of the cassette C, the shutter S2 is kept closed. During this particular period, the particles coming from the first clean room CR1 and from the sub-arm mechanism 311 are moved downward from the cassette section 351 by the down-flow of the clean air so as to be discharged through the floor exhaust port 335.

Then, the second shutter S2 is opened so as to allow the main arm mechanism 312 to be moved through the transfer port 308 and, thus, to receive the wafer W from the sub-arm mechanism 311. In this step, the cassette section 351 is kept clean by the down-flow of the clean air. Therefore, it is substantially unnecessary to worry about the flow of the particles from the cassette section 351 into the process section 352.

In the embodiment described above, the degree of opening of the exhaust ports 331 and 333 within the process section 352 can be controlled so as to control the exhaust rate from the process section 352. Therefore, the wafers W can be transferred by the method described below. Specifically, while the second shutter S2 is kept closed, the shutter 331c is slid as shown in FIG. 24 so as to make the degree of opening of the exhaust port 331b smaller than the full-open state shown in FIG. 23. As a result, the inner pressure of the process section 352 is set higher than that of the cassette section 351. If the second shutter S2 is opened under this condition, the air flows from the process section 352 toward the cassette section 351. It follows that the particles are not moved from the cassette section 351 into the process section 352.

Upon receipt of the wafers W, the main arm mechanism 312 transfers the wafers W into the treating units within the process section 352 in accordance with a predetermined recipe so as to allow the wafers W to be subjected to various treatments in a predetermined order. Upon completion of these treatments, the wafers W are returned back to the cassette section 351 by the main arm mechanism 342. When the wafers W are returned from the process section 352 back to the cassette section 351, the first shutter S1 is kept closed. It follows that the atmosphere within the first clean room CR1 is prevented from flowing into the process section 352.

Also, the atmosphere within the cassette section 351 is prevented from flowing into the process section 352 by setting the inner pressure of the process section 352 higher than that of the cassette section 351. It follows that the wafers W can be subjected to various treatments under a clean atmosphere within the various treating units arranged within the process section 352.

Incidentally, a push damper mechanism 341 shown in FIG. 27 can be used in place of the shutter 331c as the mechanism for controlling the degree of opening of each of the exhaust ports 331 and 333. The push damper mechanism 341 comprises a lid 341b mounted right under an aperture 341a on the side of the process section, a chamber 341d having an exhaust port 341c, and an air cylinder 341e for vertically moving the lid 341b. As seen from the drawing, the chamber 341d surrounds the aperture 341a and the lid 341d. In this mechanism, the exhaust rate can be controlled by vertically moving the lid 341b by the cylinder 341e. Naturally, the exhaust is stopped if the lid 341d is moved upward to close the aperture 341a.

It is also possible to mount a variable damper (not shown) within an exhaust duct communicating with the inner space of the substrate treating system 300 so as to control the exhaust rate from the process section 352.

In the substrate treating system 300 described above, a differential pressure is generated between the process section 352 and the cassette section 351 by controlling the exhaust rate from the process section 352. Alternatively, it is possible to generate a differential pressure between the process section 352 and the cassette section 351 by controlling the exhaust rate from the cassette section 351.

Further, the substrate treating system in any of the embodiments described above is of a through-the-wall type. Needless to say, however, the technical scope of the present invention also covers the case where the entire system is installed within a single clean room.

It should also be noted that an air curtain mechanism 361 as shown in FIG. 28 can be used in place of the shutters S1 and S2. For example, the air curtain mechanism 361, in which an air curtain is formed within the transfer port 308 made in the partition plate 305, is constructed as follows.

Specifically, the partition plate 305 is of a hollow structure so as to form inner passageways 363, 364. As a result, air is allowed to be circulated within the partition plate 305. As shown in the drawing, the first inner passageway 364 is open at an upper side 308a of the transfer port 308 so as to permit the clean air to be blown downward across the transfer port 308. On the other hand, the second inner passageway 363 is open at a lower side 308b of the transfer port 308 so as to permit the clean air blown downward from the first inner passageway 364 to be sucked by the second inner passageway 363. These first and second inner passageways 364, 363 communicate with a common air circulator 365 so as to form an air circulation circuit. The operation of the air circulator 365 is controlled by the controller 39 referred to previously.

Further, it is desirable to allow the second inner passageway 363 on the suction side to communicate with the exhaust space 353 or with another suction system. In the case of employing the air curtain mechanism 361, it is desirable to take a measure to stop the air blowing from the second inner passageway 364 when the wafer W is transferred through the transfer port 308. In this case, the air is prevented from being diffused around and, thus, the air stream is not disturbed.

Each of the embodiments described above is directed to a system for applying a resist-coating and developing to a semiconductor wafer. However, the present invention is not limited to the coating-developing system. Specifically, the technical idea of the present invention can also be applied to a treating system constructed to carry out a single kind of treatment such as a film-forming apparatus for forming a film on a wafer under a predetermined heating atmosphere or a system equipped with an apparatus for performing a washing treatment alone. Also, the substrate to be treated in the present invention is not limited to a wafer. For example, a glass substrate for a liquid crystal display (LCD) device can also be used as the substrate treated in the present invention.

Where the substrate treating system of the present invention is of a through-the-wall type, an air stream flowing from the first space toward the second space is not formed within the system, with the result that the particles floating within the first space are not moved into the second space in which are mounted the treating units. It follows that the treating units arranged within the second space are kept positioned under a clean atmosphere.

It should also be noted that an air stream flowing from outside the system directly into the second space can be inhibited by controlling appropriately the degree of opening of the shutter or the air blowing intensity of the air curtain, with the result that it is possible to suppress the flow of the particles into the second space having the treating units housed therein. What should also be noted is that the inner pressure of the second space (process section) can be set higher than that of the first space (cassette section) without difficulty in the step of transferring the substrate from the first space into the second space, making it possible to prevent completely the particles from entering the second space.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A substrate treating system for successively treating a plurality of substrates in a clean room under an air-conditioned environment, comprising:
    an outer casing having a cassette transfer port through which a cassette housing a plurality of substrates is transferred into and out of the outer casing;
    a cassette section arranged within an inner space surrounded by the outer casing and including a cassette table on which the cassette transferred to said inner space surrounded by the outer casing is disposed;
    a sub-arm mechanism for taking out the substrates one by one from within the cassette disposed within the cassette section;
    a process section arranged contiguous to the cassette section and having a plurality of treating units for treating the substrates;
    a main arm mechanism arranged within the process section for receiving the substrates from the sub-arm mechanism and for successively transferring the received substrates into the treating units, the treated substrates being successively transferred by the main arm mechanism out of the treating units;
    an air supply mechanism for supplying a clean air into the outer casing to form a down-stream of the clean air within the outer casing such that an air stream flowing through said cassette transfer port is formed in a manner to flow from said cassette portion into said clean room; and
    a partition plate for partitioning said inner space surrounded by the outer casing to prevent the down-flow of the clean air formed within one partitioned region from interfering with that formed within another partitioned region, said partition plate having a substrate transfer port for transferring the substrate between the adjacent partitioned regions.

2. The substrate treating system according to claim 1, wherein said partition plate is mounted substantially vertical so as not to disturb the down-flow of the clean air formed within the inner space surrounded by the outer casing.

3. The substrate treating system according to claim 1, wherein the open area of the substrate transfer port made in the partition plate is larger than the area of a single cassette projected onto the partition plate and is smaller than the sum of the areas of two cassettes projected onto the partition plate.

4. The substrate treating system according to claim 1, wherein:
    said cassette section includes a cassette lift mechanism for vertically moving the cassette;
    the open area of the substrate transfer port made in said partition plate is larger than the cross sectional area of a single substrate and smaller than the area of a single cassette projected onto the partition plate; and
    the substrate is taken out of the cassette by said sub-arm mechanism, followed by vertically moving the cassette by said cassette lift mechanism to permit the next substrate within the cassette to be located in a position adapted for the sub-arm mechanism, and subsequently taking the substrate out of the cassette by the sub-arm mechanism.

5. The substrate treating system according to claim 1, wherein said partition plate is mounted between said process section and said cassette section so as to partition the process section from the cassette section.

6. The substrate treating system according to claim 1, wherein said partition plate is mounted between said cassette table and said sub-arm mechanism so as to partition the cassette table from the sub-arm mechanism within the inner space of the cassette section.

7. The substrate treating system according to claim 1, further comprising:

an interface section which can be linked to another system and is positioned adjacent to said process section;

a second cassette table for supporting a cassette in which the substrate is temporarily housed in said interface section;

a second sub-arm mechanism serving to receive the substrate from the main-arm mechanism in said process section, transfer the received substrate onto a second cassette, take out the substrate from said second cassette, and transfer the substrate into another system; and a second air supply mechanism for supplying a clean air into said interface section to form a down-flow within the interface section.

8. The substrate treating system according to claim 7, wherein said partition plate is mounted between said interface section and said process section so as to partition the process section from the interface section.

9. The substrate treating system according to claim 7, wherein said partition plate is mounted between said second cassette table and said second sub-arm so as to partition the second cassette table from said second sub-arm within said interface section.

10. The substrate treating system according to claim 7, further comprising a second partition plate mounted between said interface section and another system so as to partition the interface section from said another system.

11. The substrate treating system according to claim 10, wherein said second partition plate is provided with a second substrate transfer port through which the substrate is transferred from the interface section to said another system.

12. The substrate treating system according to claim 1, wherein said process section includes heat-treating series treating units stacked one upon the other on side for subjecting the substrate to heat treatments and liquid-treating series treating units stacked one upon the other on the other side for subjecting the substrate to treatments with liquid.

13. A substrate treating system for successively treating a plurality of substrates arranged within an air-conditioned clean room, comprising:

an outer casing having a cassette transfer port through which a cassette housing a plurality of substrates is transferred into and out of the outer casing;

a cassette section arranged within an inner space surrounded by the outer casing and including a cassette table on which the cassette transferred to said inner space surrounded by the outer casing is disposed;

a sub-arm mechanism for taking out the substrates one by one from within the cassette disposed within the cassette section;

a process section arranged contiguous to the cassette section and having a plurality of treating units for treating the substrates;

a main arm mechanism arranged within the process section for receiving the substrates from the sub-arm mechanism and for successively transferring the received substrates into the treating units, the treated substrates being successively transferred by the main arm mechanism out of the treating units;

a plurality of air supply mechanisms for supplying a clean air into each of the cassette section and the process section to form a down-stream of the clean air within each of these sections;

an air stream detecting means for detecting the condition of the clean air stream within at least the cassette section and the process section; and control means for controlling the air supply mechanisms based on the condition of the clean air stream detected by the air stream detecting means so as to control the flow rate of the clean air into at least one of the cassette section and the process section.

14. The substrate treating system according to claim 13, wherein said air stream detecting means represents a differential pressure gauge for detecting differential pressure among at least two of said clean room, said cassette section, and said process section.

15. The substrate treating system according to claim 13, wherein said air stream detecting means represents an anemoscope for detecting a direction of the air stream flowing among at least two of said clean room, said cassette section and said process section.

16. The substrate treating system according to claim 13, wherein said control means serves to control said air supply mechanisms based on the results of detection supplied from said air stream detecting means such that no substantial air stream is formed between the cassette section and the process section, and that an air stream flowing through said cassette transfer port is formed in a manner to flow from said cassette section into said clean room.

17. The substrate treating system according to claim 13, wherein said process section includes heat-treating series treating units stacked one upon the other on side for subjecting the substrate to heat treatments and liquid-treating series treating units stacked one upon the other on the other side for subjecting the substrate to treatments with liquid.

18. A method of successively treating a plurality of substrates within a process section surrounded by an outer casing provided with apertures communicating with a clean room, comprising the steps of:

(a) partitioning a second space in which said process section is arranged from a first space in which a cassette section is arranged with a partition plate provided with a substrate transfer port;

(b) supplying a clean air into each of the first and second spaces to form a down-flow of the clean air within each of the first and second spaces;

(c) transferring a cassette having a plurality of substrates loaded therein into the cassette section through the aperture of the outer casing;

(d) taking the substrate out of the cassette positioned within the cassette chamber;

(e) setting an inner pressure of the second space higher than an inner pressure of the first space in preparation for transference of the substrate taken out of the cassette through the substrate transfer port made in the partition plate; and (f) transferring the substrate into the second space so as to treat the substrate in the process section.

19. The method of successively treating a plurality of substrates according to claim 18, wherein an inner pressures of the clean room, said inner pressure of the first space and said inner pressure of the second space respectively are detected in said step (e), and the clean air supply into the first and second spaces is controlled in said step (b) based on the results of detection in step (c).

20. The method of successively treating a plurality of substrates according to claim 18, wherein the substrate transfer port made in the partition plate is kept closed in said step (b) when the substrate is not transferred between the first and second spaces.

21. The method of successively treating a plurality of substrates according to claim 18, wherein the substrate transfer port made in the partition plate is kept closed in said step (f) when the substrate is being treated in said process section.

22. A substrate treating system for successively treating a plurality of substrates arranged within an air-conditioned clean room, comprising:

an outer casing having a cassette transfer port through which a cassette housing a plurality of substrates is transferred into and out of the outer casing;

a cassette section arranged within a first space surrounded by the outer casing and including a cassette table on which the cassette transferred into the outer casing through the cassette transfer port is disposed;

a sub-arm mechanism arranged within the first space for taking out the substrates one by one from within the cassette disposed within the cassette section;

a process section arranged within a second space surrounded by the outer casing and positioned adjacent to the cassette section and having a plurality of treating units for treating the substrates;

a main arm mechanism arranged within the second space for receiving the substrates from the sub-arm mechanism and for successively transferring the received substrates into the treating units, the treated substrates being successively transferred by the main arm mechanism out of the treating units;

a plurality of air supply mechanisms for supplying a clean air into each of the first and second spaces to form a down-flow of the clean air within each of the first and second spaces such that the inner pressure of each of the first and second spaces is higher than that of the clean room;

a partition plate provided with a substrate transfer port communicating with each of the first and second spaces, said partition plate serving to partition the second space from the first space;

first shutter means for opening/closing the cassette transfer port; and second shutter means for opening/closing the substrate transfer port made in the partition plate.

23. The substrate treating system according to claim 22, wherein said outer casing extends over a plurality of clean rooms, and said cassette transfer port is open at only one clean room.

24. The substrate treating system according to claim 22, wherein said second shutter means includes:

an air supply source;

a first inner passageway formed within said partition plate, communicating with said air supply source, and open at an upper portion of said substrate transfer port;

a suction mechanism; and a second inner passageway formed within said partition plate, communicating with said suction mechanism, and open at a lower portion of the substrate transfer port, air being supplied into said first inner passageway and sucked through said second inner passageway so as to form an air curtain in said substrate transfer port.

25. The substrate treating system according to claim 22, further comprising:

an air passageway formed in a bottom portion of said outer casing and communicating with at least one of said first space and the second space; and an exhaust control mechanism for controlling the degree of opening of said air passageway.

26. The substrate treating system according to claim 22, further comprising:

an air passageway formed in a side portion of said outer casing and communicating with at least one of said first space and the second space; and an exhaust control mechanism for controlling the degree of opening of said air passageway.

* * * * *